United States Patent
Lu et al.

(10) Patent No.: US 12,300,644 B2
(45) Date of Patent: May 13, 2025

(54) DIE BONDING PADS AND METHODS OF FORMING THE SAME

(71) Applicant: Taiwan Semiconductor Manufacturing Co., Ltd., Hsinchu (TW)

(72) Inventors: Wen-Hsiung Lu, Tainan (TW); Ming-Da Cheng, Taoyuan (TW); Chia-Li Lin, Tainan (TW); Yu-Chih Huang, Hsinchu (TW); Chen-Shien Chen, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 332 days.

(21) Appl. No.: 17/841,223

(22) Filed: Jun. 15, 2022

(65) Prior Publication Data

US 2023/0307392 A1 Sep. 28, 2023

Related U.S. Application Data

(60) Provisional application No. 63/269,989, filed on Mar. 28, 2022.

(51) Int. Cl.
*H01L 23/48* (2006.01)
*H01L 21/66* (2006.01)
*H01L 23/00* (2006.01)

(52) U.S. Cl.
CPC .............. *H01L 24/05* (2013.01); *H01L 24/03* (2013.01); *H01L 24/06* (2013.01); *H01L 24/08* (2013.01); *H01L 24/80* (2013.01); *H01L 24/94* (2013.01); *H01L 2224/03462* (2013.01); *H01L 2224/03845* (2013.01); *H01L 2224/05026* (2013.01); *H01L 2224/05147* (2013.01); *H01L 2224/05564* (2013.01); *H01L 2224/0558* (2013.01); *H01L 2224/05647* (2013.01); *H01L 2224/06517* (2013.01); *H01L 2224/08147* (2013.01); *H01L 2224/80203* (2013.01); *H01L 2224/80379* (2013.01); *H01L 2224/80896* (2013.01);
(Continued)

(58) Field of Classification Search
CPC . H01L 2924/20105; H01L 2924/20102; H01L 2924/80896; H01L 2924/80379; H01L 2924/08147; H01L 2224/08147; H01L 2224/03462–06517; H01L 24/94; H01L 24/80; H01L 24/05–08
See application file for complete search history.

(56) References Cited

U.S. PATENT DOCUMENTS

| | | | |
|---|---|---|---|
| 6,245,655 B1 * | 6/2001 | Moslehi | H01L 21/76879 438/677 |
| 7,843,063 B2 | 11/2010 | Baker-O'Neal et al. | |
| 2019/0157333 A1 * | 5/2019 | Tsai | H01L 21/78 |

FOREIGN PATENT DOCUMENTS

KR 20100127756 A 12/2010

* cited by examiner

*Primary Examiner* — Hoa B Trinh
(74) *Attorney, Agent, or Firm* — Slater Matsil, LLP

(57) ABSTRACT

In an embodiment, a device includes: a dielectric layer over an active surface of a semiconductor substrate; a conductive via in the dielectric layer, the conductive via including a first copper layer having a non-uniform grain orientation; and a bonding pad over the conductive via and in the dielectric layer, the bonding pad including a second copper layer having a uniform grain orientation, a top surface of the bonding pad being coplanar with a top surface of the dielectric layer.

20 Claims, 20 Drawing Sheets

(52) U.S. Cl.
CPC ............... *H01L 2224/94* (2013.01); *H01L 2924/20102* (2013.01); *H01L 2924/20105* (2013.01); *H01L 2924/20106* (2013.01); *H01L 2924/20107* (2013.01)

DIE BONDING PADS AND METHODS OF FORMING THE SAME

PRIORITY CLAIM AND CROSS-REFERENCE

This application claims the benefit of U.S. Provisional Application No. 63/269,989, filed on Mar. 28, 2022, which application is hereby incorporated herein by reference.

BACKGROUND

Since the development of the integrated circuit (IC), the semiconductor industry has experienced continued rapid growth due to continuous improvements in the integration density of various electronic components (e.g., transistors, diodes, resistors, capacitors, etc.). For the most part, these improvements in integration density have come from repeated reductions in minimum feature size, which allows more components to be integrated into a given area. As the demand for miniaturization, higher speed, greater bandwidth, and lower power consumption and latency has grown, there has grown a need for smaller and more creative techniques for packaging semiconductor dies.

Stacked semiconductor devices have emerged as an effective technique for further reducing the physical size of a semiconductor device. In a stacked semiconductor device, active circuits such as logic and memory circuits are fabricated on different semiconductor wafers. Two or more semiconductor wafers may be bonded together through suitable bonding techniques to further reduce the form factor of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
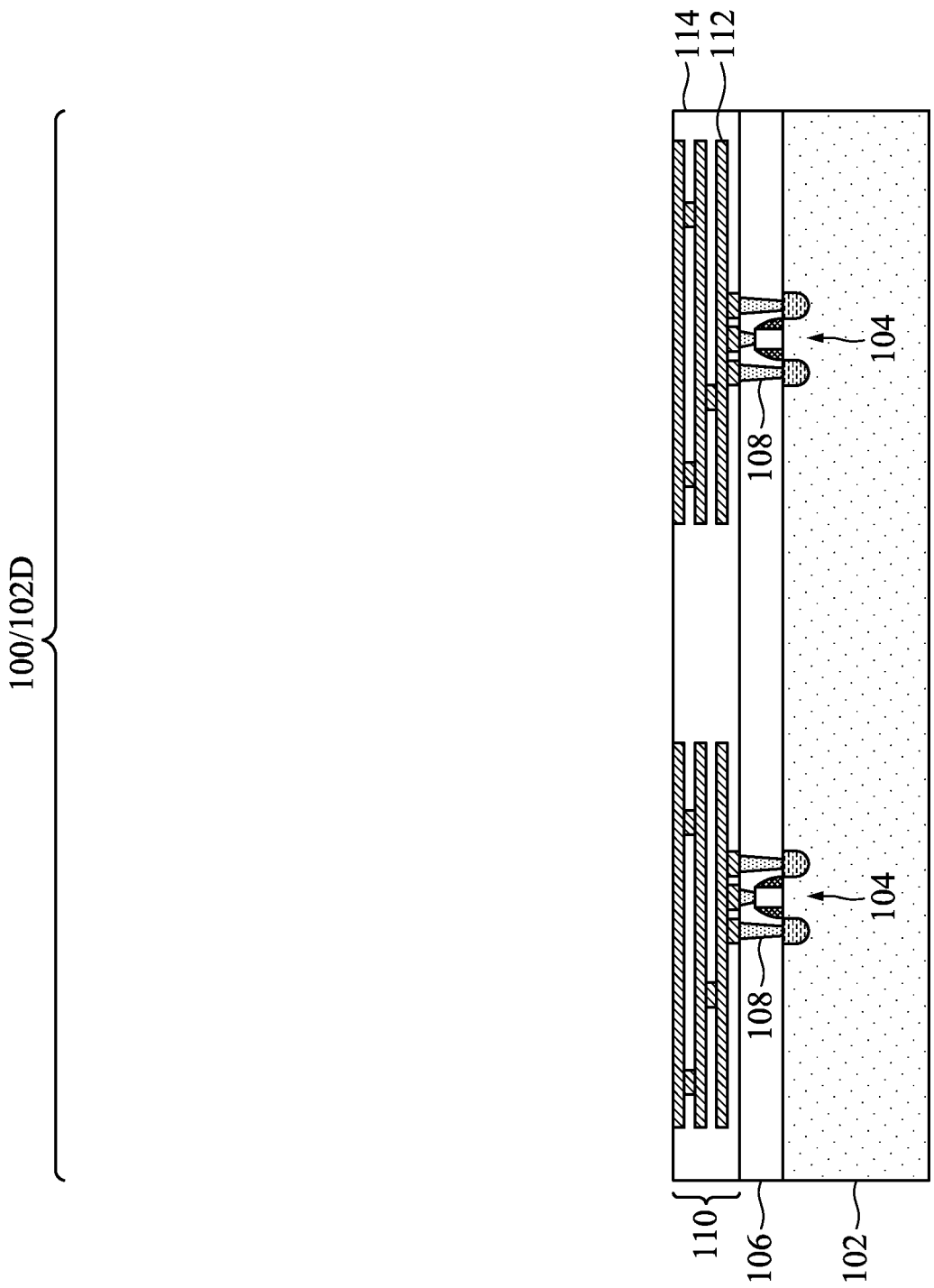
FIGS. 1-8 are cross-sectional views of intermediate stages in the manufacturing of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, die stacks are formed by bonding integrated circuit dies, and the bonding pads for integrated circuit dies include nano-twinned copper layers. Nano-twinned copper may intermingle at a lower temperature and a lower pressure than non-twinned copper. As such, a low-temperature bonding process may be utilized during the bonding of the integrated circuit dies. Utilizing a low-temperature bonding process may improve reliability of the resulting die stack and improve the ease of die integration. Additionally, nano-twinned copper can withstand greater tensile strain and has greater electromigration than non-twinned copper. As such, the bonding strength between the bonding pads is large, and the bonding strength does not significantly decrease as a result of any subsequently performed thermal annealing processes.

FIGS. 1-8 are cross-sectional views of intermediate stages in the manufacturing of an integrated circuit die 100, in accordance with some embodiments. A device region 102D is shown, and an integrated circuit die 100 is formed in the device region 102D. The integrated circuit die 100 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The integrated circuit die 100 may be formed in a wafer, which may include a plurality of device regions 102D. The device regions 102D will be subsequently singulated to form the integrated circuit dies 100.

In FIG. 1, a semiconductor substrate 102 is formed or provided. The semiconductor substrate 102 may be a silicon substrate, doped or undoped, or an active layer of a semiconductor-on-insulator (SOI) substrate. The semiconductor substrate 102 may include other semiconductor materials, such as germanium; a compound semiconductor including silicon carbide, gallium arsenic, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 102 has an active surface (e.g., the surface facing upwards in FIG. 1), sometimes called a front side, and an inactive surface (e.g., the surface facing downwards in FIG. 1), sometimes called a back side.

Devices 104 (represented by a transistor) are formed at the active surface of the semiconductor substrate 102. The devices 104 may be active devices (e.g., transistors, diodes, etc.), capacitors, resistors, etc. The devices 104 may be formed in a front-end of line (FEOL) process by acceptable deposition, photolithography, and etching techniques. For example, the devices 104 may include gate structures and source/drain regions, where the gate structures are on channel regions, and the source/drain regions are adjacent the channel regions. The channel regions may be patterned regions of the semiconductor substrate 102. For example, the channel regions may be regions of semiconductor fins, semiconductor nanosheets, semiconductor nanowires, or the like patterned in the semiconductor substrate 102. When the devices 104 are transistors, they may be nanostructure field-effect transistors (Nanostructure-FETs), fin field-effect transistors (FinFETs), planar transistors, or the like.

An inter-layer dielectric 106 is formed over the active surface of the semiconductor substrate 102. The inter-layer dielectric 106 surrounds and may cover the devices 104. The inter-layer dielectric 106 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, which may be formed by a deposition process such as chemical vapor deposition (CVD) or the like. Contacts 108 are formed through the inter-layer dielectric 106 to electrically and physically couple the devices 104. For example, when the devices 104 are transistors, the contacts 108 may couple the gates and source/drain regions of the transistors. The contacts 108 may be formed of a suitable conductive material such as tungsten, cobalt, nickel, copper, silver, gold, aluminum, the like, or combinations thereof, which may be formed by a deposition process such as physical vapor deposition (PVD) or CVD, a plating process such as electrolytic or electroless plating, or the like.

An interconnect structure 110 is formed over the inter-layer dielectric 106 and contacts 108. The interconnect structure 110 interconnects the devices 104 to form an integrated circuit, and may be formed in a back-end of line (BEOL) process. The interconnect structure 110 may be formed of, for example, metallization patterns 112 in dielectric layers 114. The dielectric layers 114 may be, e.g., low-k dielectric layers. The metallization patterns 112 include metal lines and vias, which may be formed in the dielectric layers 114 by a damascene process, such as a single damascene process, a dual damascene process, or the like. The metallization patterns 112 may be formed of a suitable conductive material, such as copper, tungsten, aluminum, silver, gold, a combination thereof, or the like. The metallization patterns 112 are electrically coupled to the devices 104 by the contacts 108.

Figure 2:
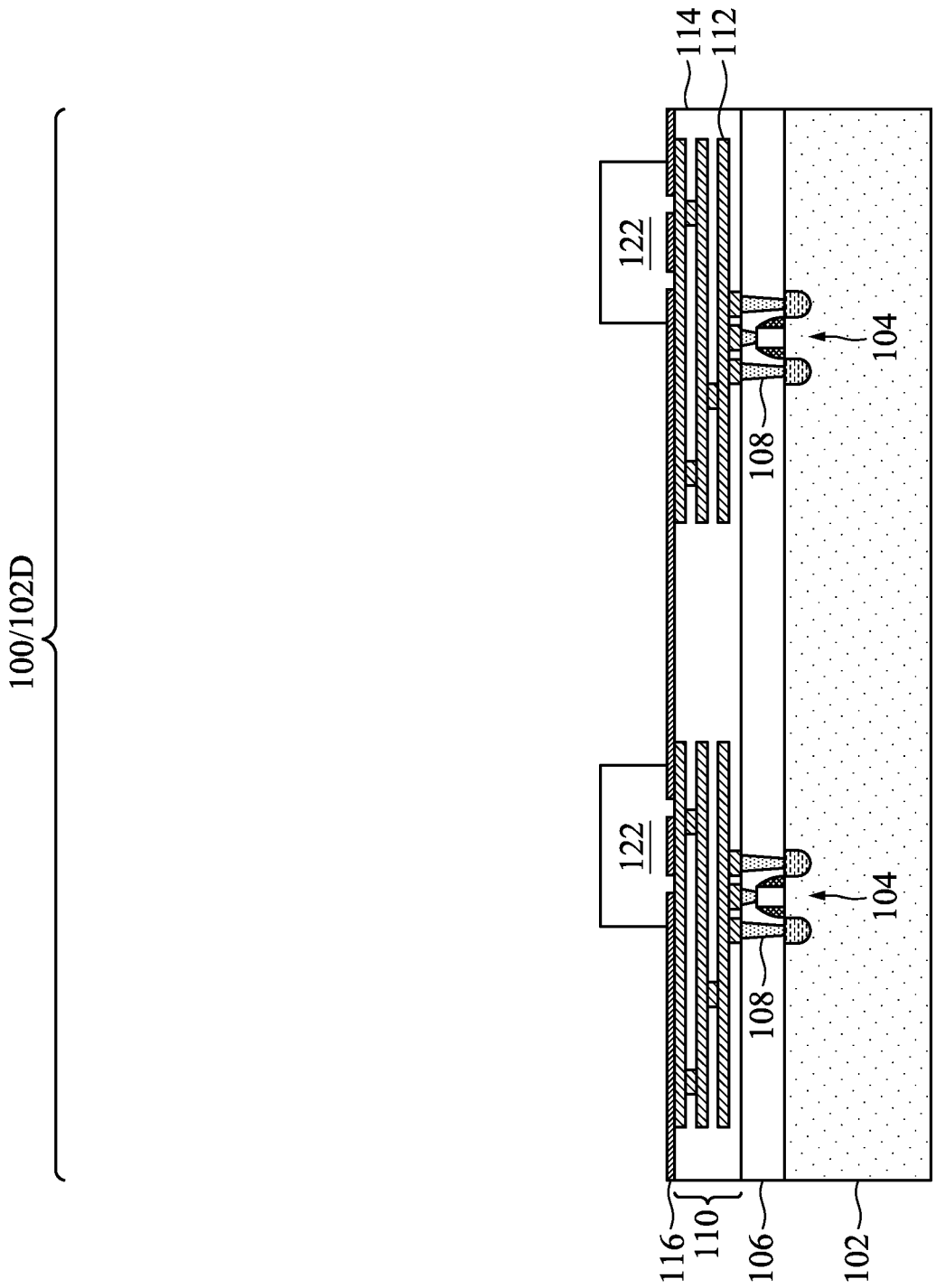

In FIG. 2, one or more passivation layer(s) 116 are formed on the interconnect structure 110. The passivation layer(s) 116 may be formed of one or more suitable dielectric materials such as silicon oxynitride, silicon nitride, low-k dielectrics such as carbon doped oxides, extremely low-k dielectrics such as porous carbon doped silicon oxide, or the like; a polymer such as polyimide, solder resist, polybenzoxazole (PBO), a benzocyclobutene (BCB) based polymer, molding compound, or the like; the like; or a combination thereof. The passivation layer(s) 116 may be formed by CVD, spin coating, lamination, the like, or a combination thereof. In some embodiments, the passivation layer(s) 116 include a silicon nitride layer.

Testing pads 122 are formed extending through the passivation layer(s) 116 to electrically and physically couple to the upper metallization pattern 112 of the interconnect structure 110. The testing pads 122 are used for device testing, and may not be coupled to the interconnect structure 110 during normal operation of the integrated circuit die 100. In some embodiments, the testing pads 122 are formed of a low-cost conductive material (e.g., aluminum). The testing pads 122 may be formed by a damascene process, such as a single damascene process.

Circuit probe (CP) testing is then performed on the integrated circuit die 100 to ascertain whether the integrated circuit die 100 is a known good die (KGD). The integrated circuit die 100 is tested by use of a probe. The probe is electrically and physically coupled to the testing pads 122 by, e.g., test connectors. Only integrated circuit dies 100 which are KGDs undergo subsequent processing and packaging, and dies which fail the CP testing are not further processed. The testing may include testing of the functionality of the integrated circuit die 100, or may include testing for known open or short circuits that may be expected based on the design of the integrated circuit die 100. After testing is complete, the probe is removed and any excess reflowable material on the testing pads 122 may be removed by, e.g., an etching process, a chemical-mechanical polish (CMP), a grinding process, or the like.

Figure 3:
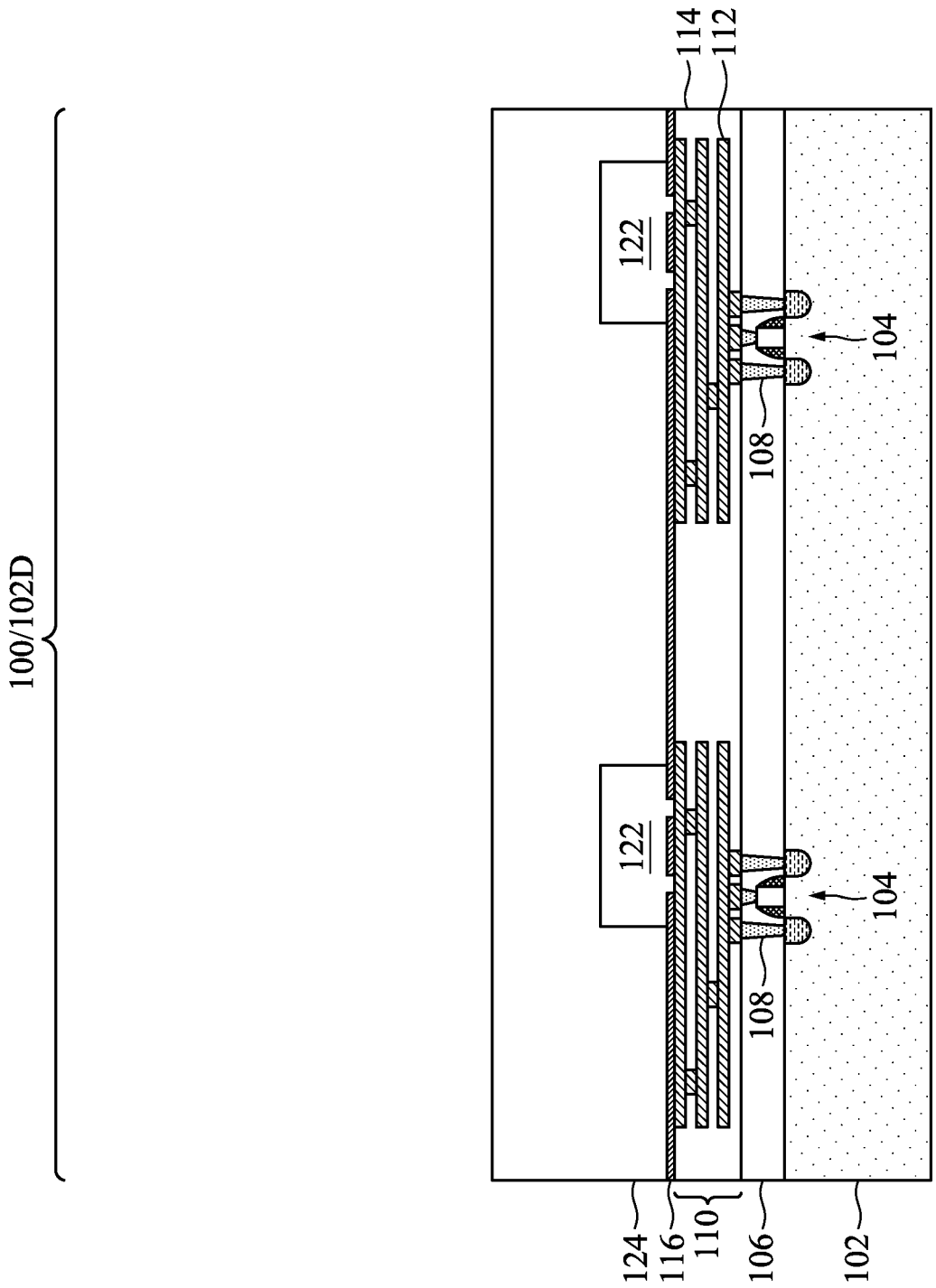

In FIG. 3, a dielectric layer 124 is formed on the testing pads 122 and the passivation layer(s) 116. The dielectric layer 124 laterally surrounds the testing pads 122, and buries the testing pads 122 such that the testing pads 122 remain isolated in the integrated circuit die 100. The dielectric layer 124 may be formed of a polymer such as PBO, polyimide, a BCB-based polymer, or the like; a nitride such as silicon nitride or the like; an oxide such as silicon oxide, phosphosilicate glass (PSG), borosilicate glass (BSG), boron-doped phosphosilicate glass (BPSG), a tetraethyl orthosilicate (TEOS) based oxide; the like, or a combination thereof. The dielectric layer 124 may be formed, for example, by spin coating, lamination, CVD, or the like. In some embodiments, the dielectric layer 124 is formed of TEOS-based silicon oxide.

Figure 4:
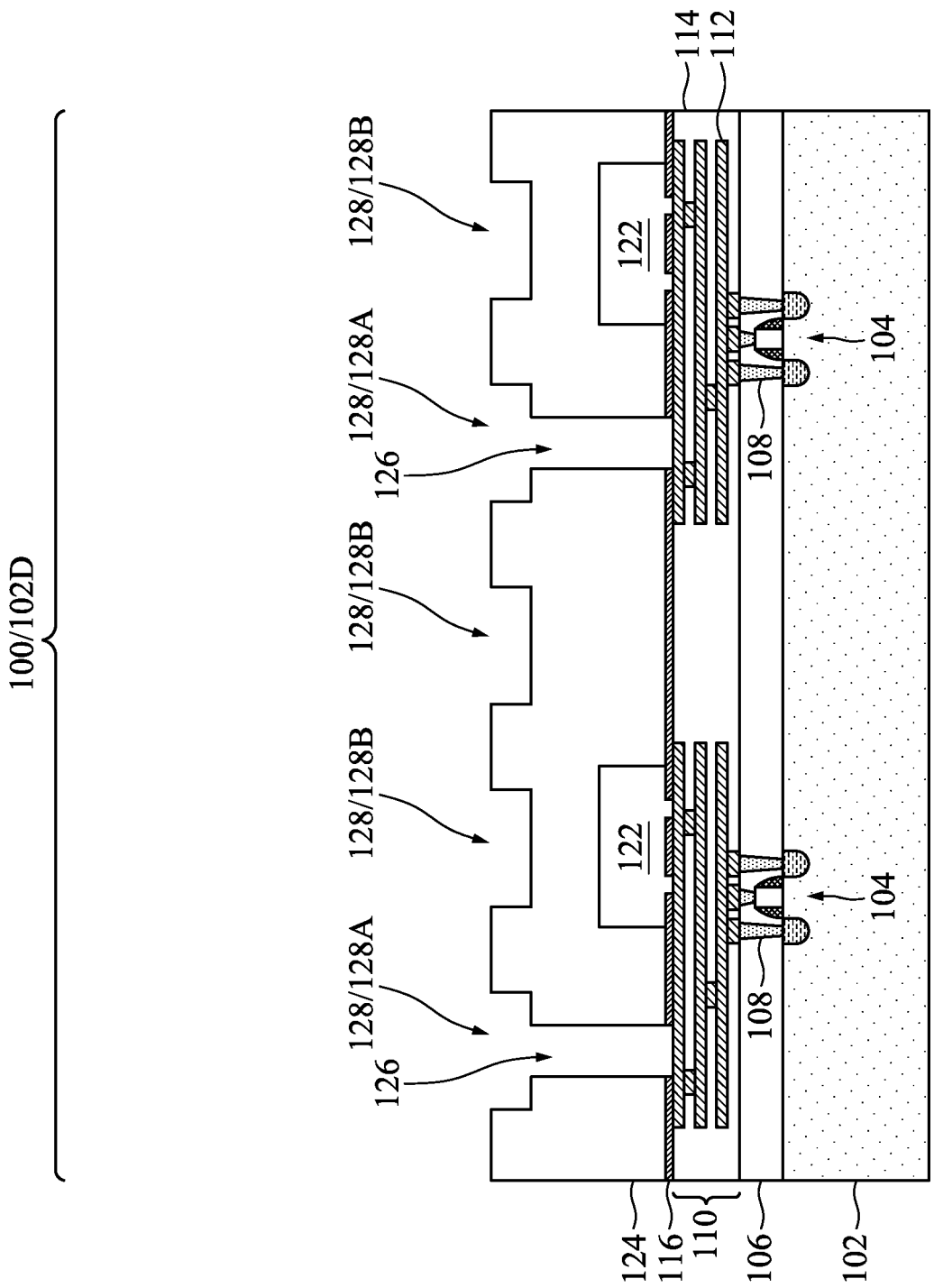

In FIG. 4, interconnect openings (including via openings 126 and trenches 128) are patterned in the dielectric layer 124 and the passivation layer(s) 116. The interconnect openings may be formed by acceptable photolithography and etching techniques. The via openings 126 extend through the dielectric layer 124 and the passivation layer(s) 116, and expose the upper metallization pattern 112 of the interconnect structure 110. The trenches 128 are recesses that extend into the dielectric layer 124. A first subset of the trenches 128A are disposed above respective via openings 126 in the illustrated cross-section, such that the via openings 126 connect the trenches 128A to the upper metallization pattern 112 of the interconnect structure 110. A second subset of the trenches 128B are not disposed above respective via openings 126 in the illustrated cross-section. The via openings 126 have a large aspect ratio (e.g., ratio of height to width). In some embodiments, the via openings 126 have an aspect ratio in the range of 0.5 to 12. The trenches 128 have a low aspect ratio. In some embodiments, the trenches 128 have an aspect ratio in the range of 0.2 to 3.

Figure 5:
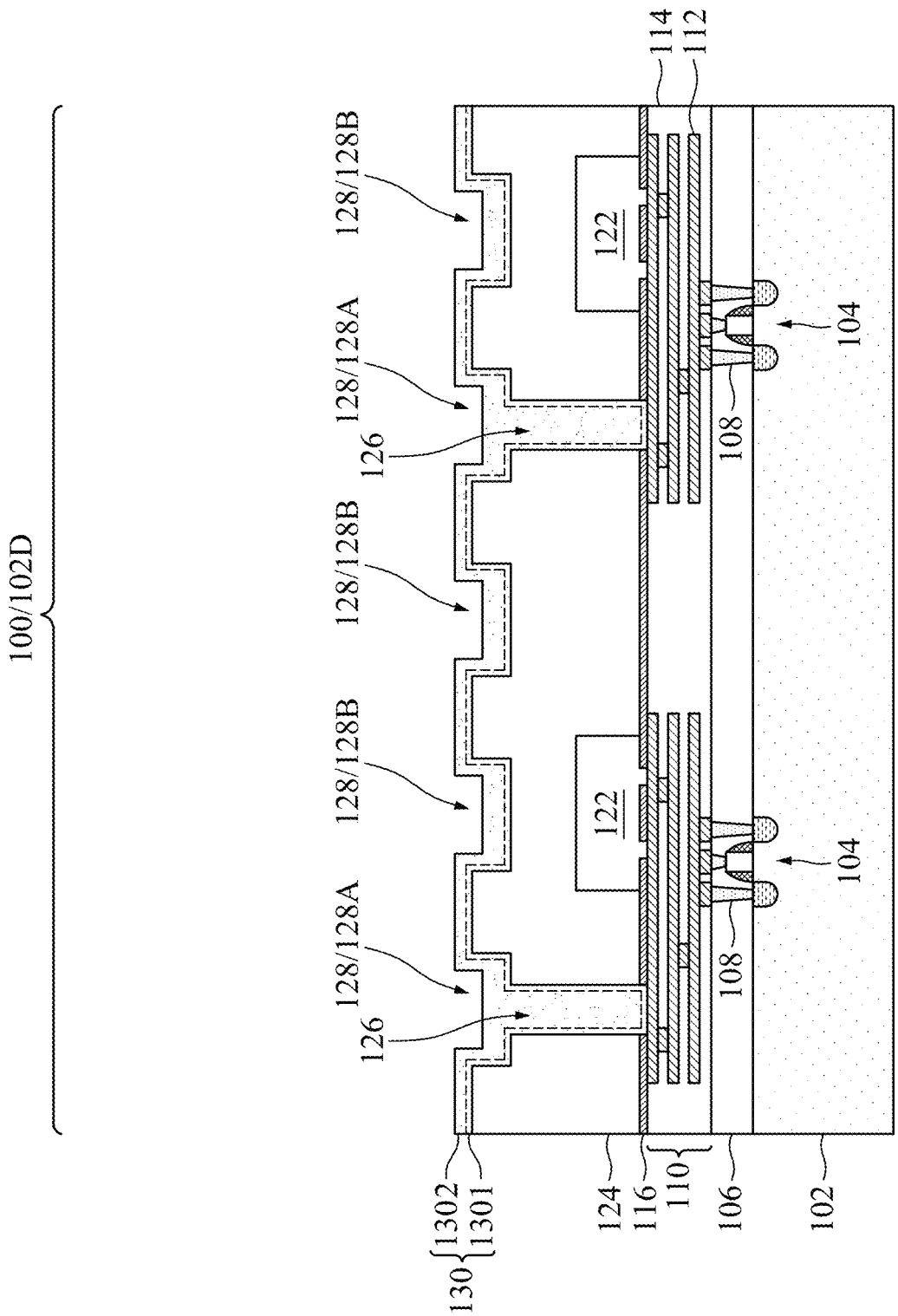

In FIG. 5, a conductive layer 130 is formed in the via openings 126 and the lower portions of the trenches 128. The conductive layer 130 may be formed of a conductive material, such as copper, aluminum, tungsten, cobalt, gold, combinations thereof, or the like, which can be formed by a plating process such as electrolytic or electroless plating, a deposition process such as physical vapor deposition (PVD) or CVD, or the like.

In some embodiments, the conductive layer 130 is formed of copper, such that the conductive layer 130 is a copper layer. The copper layer has a polycrystalline structure including a plurality of grains. The grains have a non-uniform orientation, such that no majority of the grains has a same lattice direction. A copper layer with a non-uniform grain orientation may be referred to as a non-twinned copper layer. The polycrystalline structure of the conductive layer 130 will be subsequently described for FIGS. 9-11. In other embodiments, the conductive layer 130 is formed of another conductive material.

The thickness of the conductive layer 130 is small, and is controlled so that the conductive layer 130 fills the via openings 126 but does not fill the trenches 128. Specifically, the conductive layer 130 is formed to a thickness that is small enough that the conductive layer 130 does not completely fill the trenches 128, but is large enough that the conductive layer 130 completely fills the via openings 126. In some embodiments, the conductive layer 130 is formed to a thickness in the range of 1 µm to 6 µm.

In this embodiment, the conductive layer 130 is formed by a conformal process, such that the conductive layer 130 in the trenches 128 conformally lines the bottoms and sidewalls of the trenches 128. Accordingly, the thickness of the conductive layer 130 at the bottoms of the trenches 128 is substantially equal (within process variations) to the thickness of the conductive layer 130 at the sidewalls of the trenches 128. In another embodiment (subsequently described for FIGS. 15-17), the conductive layer 130 is formed by a bottom-up process, such that the thickness of the conductive layer 130 at the bottoms of the trenches 128 is greater than the thickness of the conductive layer 130 at the sidewalls of the trenches 128.

As an example to form the conductive layer 130 by a conformal process, a seed layer 1301 is formed on the dielectric layer 124 and in the interconnect openings (including the via openings 126 and the trenches 128). In some embodiments, the seed layer 1301 is a metal layer, which may be a single layer or a composite layer including a plurality of sub-layers formed of different materials. In some embodiments, the seed layer 1301 includes a titanium layer and a copper layer over the titanium layer. The seed layer 1301 may be formed using, for example, physical vapor deposition (PVD) or the like. A conductive material 1302, such as one of those previously described, is then plated on the seed layer 1301. In some embodiments, the conductive material 1302 is copper formed by an electroplating process. The electroplating process has a large plating conformality, such that the plating rate in the via openings 126 is substantially equal (within process variations) to the plating rate in the trenches 128. Specifically, the conductive material 1302 is formed by submerging the seed layer 1301 in a plating solution. The plating solution may be, e.g., a sulfuric acid electrolyte. The plating solution includes cations of the conductive material 1302. An electric current is applied to the plating solution to reduce the cations and thereby form the conductive material 1302. The conductive material 1302 may be plated with a low plating current (which allows the electroplating process to have a large plating conformality) and may be plated for a short duration (which decreases the thickness of the conductive layer 130). In some embodiments, the conductive material 1302 is plated with a plating current in the range of 1 A to 5 A and for a duration in the range of 80 seconds to 300 seconds. Plating the conductive material 1302 using a plating current and a duration in these ranges allows the conductive layer 130 to be formed to a desired thickness (previously described). As will be subsequently described in greater detail, the portions of the conductive layer 130 in the via openings 126 will form conductive vias 152 (see FIG. 7). Plating the conductive material 1302 with a large plating conformality also decreases the risks of voids or cracks forming in the conductive vias 152, particularly when the via openings 126 have a large aspect ratio. Avoiding the formation of voids or cracks in the conductive vias 152 decreases the resistance of the conductive vias 152, thereby increasing the performance of the integrated circuit die 100.

Figure 6:
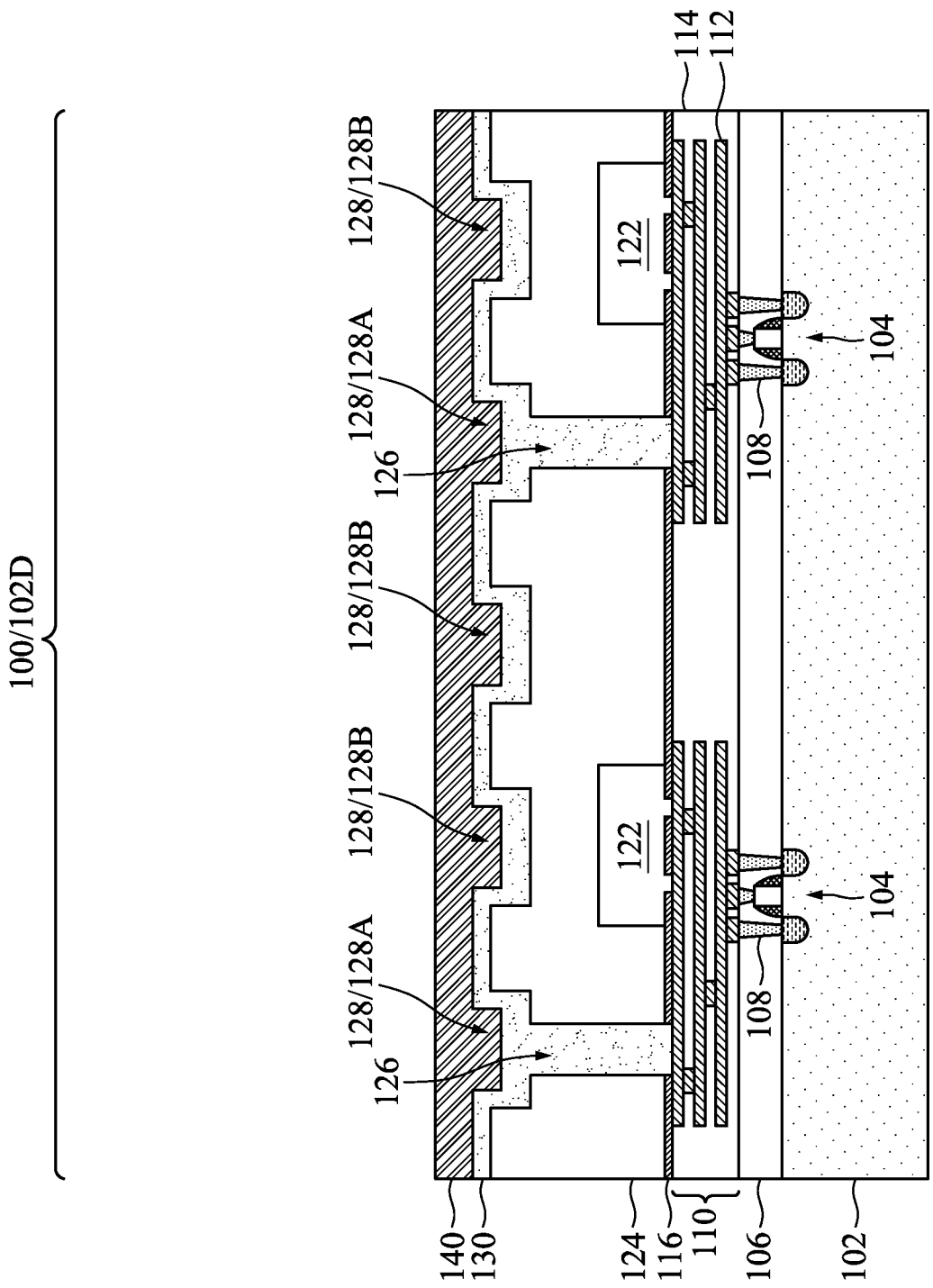

In FIG. 6, a conductive layer 140 is formed in the upper portions of the trenches 128. The conductive layer 140 may be formed of a conductive material, such as copper, aluminum, tungsten, cobalt, gold, combinations thereof, or the like, which can be formed by a plating process such as electrolytic or electroless plating, a deposition process such as physical vapor deposition (PVD) or CVD, or the like.

In some embodiments, the conductive layer 140 is formed of copper, such that the conductive layer 140 is a copper layer. The copper layer has a polycrystalline structure including a plurality of grains. The grains have a uniform orientation, such that a majority of the grains have a same lattice direction. A copper layer with a uniform grain orientation may be referred to as a nano-twinned copper layer. As will be subsequently described in greater detail, the portions of the conductive layer 140 and the conductive layer 130 in the trenches 128 will form bonding pads 154 (see FIG. 7). Forming the bonding pads 154 of a conductive material with a uniform grain orientation allows a subsequent bonding process to be performed at a low temperature and improves the strength of the resulting bonds, thereby increasing the reliability of the integrated circuit die 100. The polycrystalline structure of the conductive layer 140 will be subsequently described for FIGS. 9-11. In other embodiments, the conductive layer 140 is formed of another conductive material. More generally, the conductive layer 140 may be formed of any conductive material having a polycrystalline structure.

The thickness of the conductive layer 140 is large, and is controlled so that the conductive layer 140 fills the trenches 128 (including the trenches 128A, 128B in this embodiment). Specifically, the conductive layer 140 is formed to a thickness that is large enough that the conductive layer 140 completely fills (and may overfill) the trenches 128. In some embodiments, the conductive layer 140 is formed to a thickness in the range of 0.1 µm to 6 µm. The conductive layer 140 fills the remainder of the trenches 128 that is not filled by the conductive layer 130. The conductive layer 140 may be thicker than the conductive layer 130.

As an example to form the conductive layer 140, a conductive material, such as one of those previously described, is plated on the conductive layer 130. In some embodiments, the conductive material is copper formed by an electroplating process. Specifically, the conductive material is formed by submerging the conductive layer 130 in a plating solution. The plating solution may be, e.g., a sulfuric acid electrolyte. The plating solution includes cations of the conductive material. In some embodiments, the same plating solution is used to plate the conductive layer 130 and the conductive layer 140. An electric current is applied to the plating solution to reduce the cations and thereby form the conductive material. The conductive material may be plated with a high plating current (which allows the electroplating process to form the conductive material with a uniform grain orientation) and may be plated for a long duration (which increases the thickness of the conductive layer 140). The conductive layer 140 is plated with a greater plating current and for a longer duration than the conductive layer 130. In some embodiments, the conductive material is plated with a plating current in the range of 7 A to 12 A and for a duration in the range of 250 seconds to 500 seconds. Plating the conductive material using a plating current and a duration in these ranges allows the conductive layer 140 to be formed to a desired thickness (previously described), and allows the plated conductive material to have a uniform grain orientation. Additionally, because the trenches 128 have a low aspect ratio, the risk of voids or cracks forming in the conductive layer 140 is low, even if the conductive material is not plated with a large plating conformality.

Figure 7:
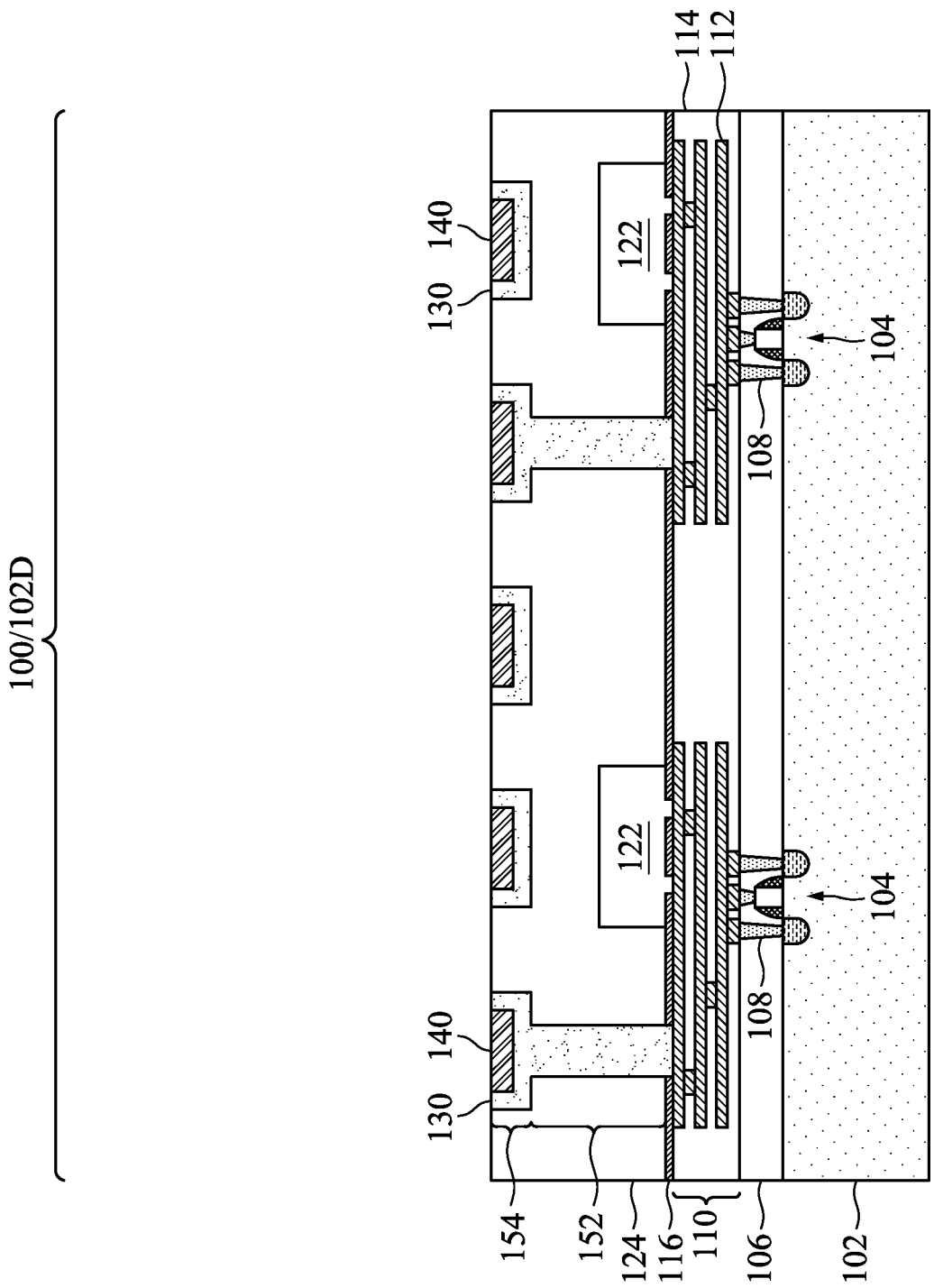

In FIG. 7, a removal process is performed to remove excess portions of the conductive layers 130, 140, which excess portions are over the top surface of the dielectric layer 124, thereby forming the conductive vias 152 and the bonding pads 154. After the removal process, the conductive layer 130 has portions left in the via openings 126 (thus forming the conductive vias 152) and the conductive layers 130, 140 have portions left in the trenches 128 (thus forming the bonding pads 154). In some embodiments, a planarization process such as a chemical mechanical polish (CMP), an etch-back process, combinations thereof, or the like may be utilized. The planarization process is performed until a top surface of the conductive layer 140 is substantially coplanar (within process variations) with a top surface of the conductive layer 130 and a top surface of the dielectric layer 124. After the planarization process, the top surfaces of the dielectric layer 124 and the bonding pads 154 are substantially coplanar (within process variations). The substantially coplanar top surfaces of the dielectric layer 124 and the bonding pads 154 are at the front side of the integrated circuit die 100, which will be used for a subsequent bonding process.

As noted above, the thickness of the conductive layer 130 is small and the thickness of the conductive layer 140 is large. Because of this, the conductive vias 152 include portions of the conductive layer 130 and do not include any portions of the conductive layer 140. Similarly, the bonding pads 154 include portions of both the conductive layers 130, 140. The conductive layer 130 of each conductive via 152 is continuous with the conductive layer 130 of the respective overlying bonding pad 154. As noted above, the conductive layer 130 is plated with a large plating conformality. Specifically, the conductive layer 130 is plated with a larger plating conformality than the conductive layer 140. Omitting the conductive layer 140 from the conductive vias 152 such that the conductive vias 152 include conductive layers 130 plated with a large plating conformality decreases the risks of voids or cracks forming in the conductive vias 152, particularly when the conductive vias 152 have a high aspect ratio. In this embodiment where the conductive layer 130 is conformally formed, a horizontal portion of a conductive layer 130 in a bonding pad 154 (e.g., a portion beneath the conductive layer 140) has a substantially same thickness (within process variations) as a vertical portion of the conductive layer 130 in the bonding pad 154 (e.g., a portion between the conductive layer 140 and the dielectric layer 124).

Figure 8:
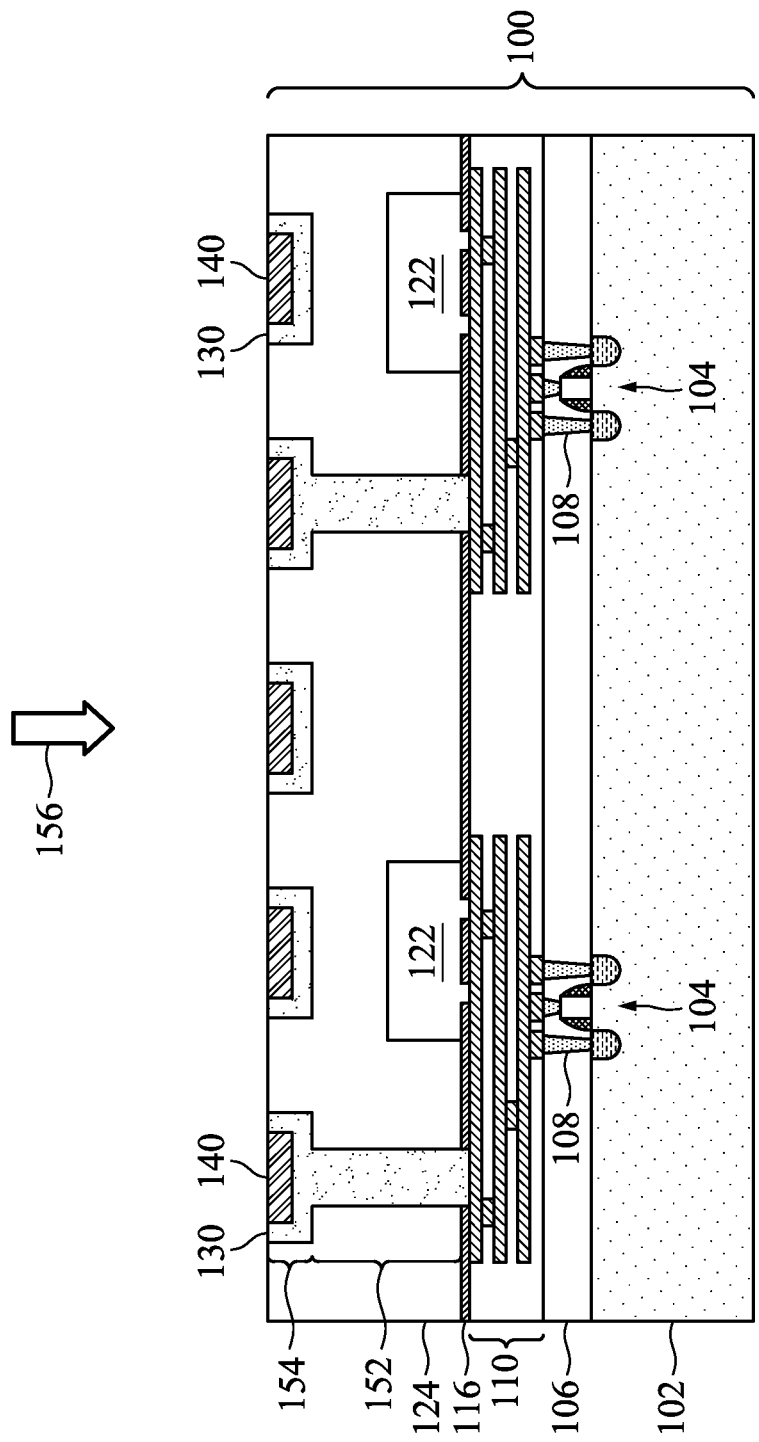

In FIG. 8, a singulation process 156 is performed by along scribe line regions, e.g., between the device region 102D and adjacent device regions (not separately illustrated). The singulation process 156 may include a sawing process, a laser cutting process, or the like. The singulation process 156 singulates the device region 102D from the adjacent device regions. The resulting, singulated integrated circuit die 100 is from the device region 102D. After the singulation process 156, singulated portions of the semiconductor substrate 102, the inter-layer dielectric 106, the interconnect structure 110, the passivation layer(s) 116, and the dielectric layer 124 are laterally coterminous.

The bonding pads 154 will be utilized for a subsequent bonding process. Each bonding pad 154 includes a conductive layer 130 and a conductive layer 140. As noted above, the material(s) of the conductive layers 130, 140 have a polycrystalline structure including a plurality of grains. The grains of the conductive layer 130 have a non-uniform orientation. The grains of the conductive layer 140 have a uniform orientation. The polycrystalline structure of the conductive layers 130, 140 are described for FIGS. 9-11, which illustrate various views of the conductive layers 130, 140.

Figure 9:
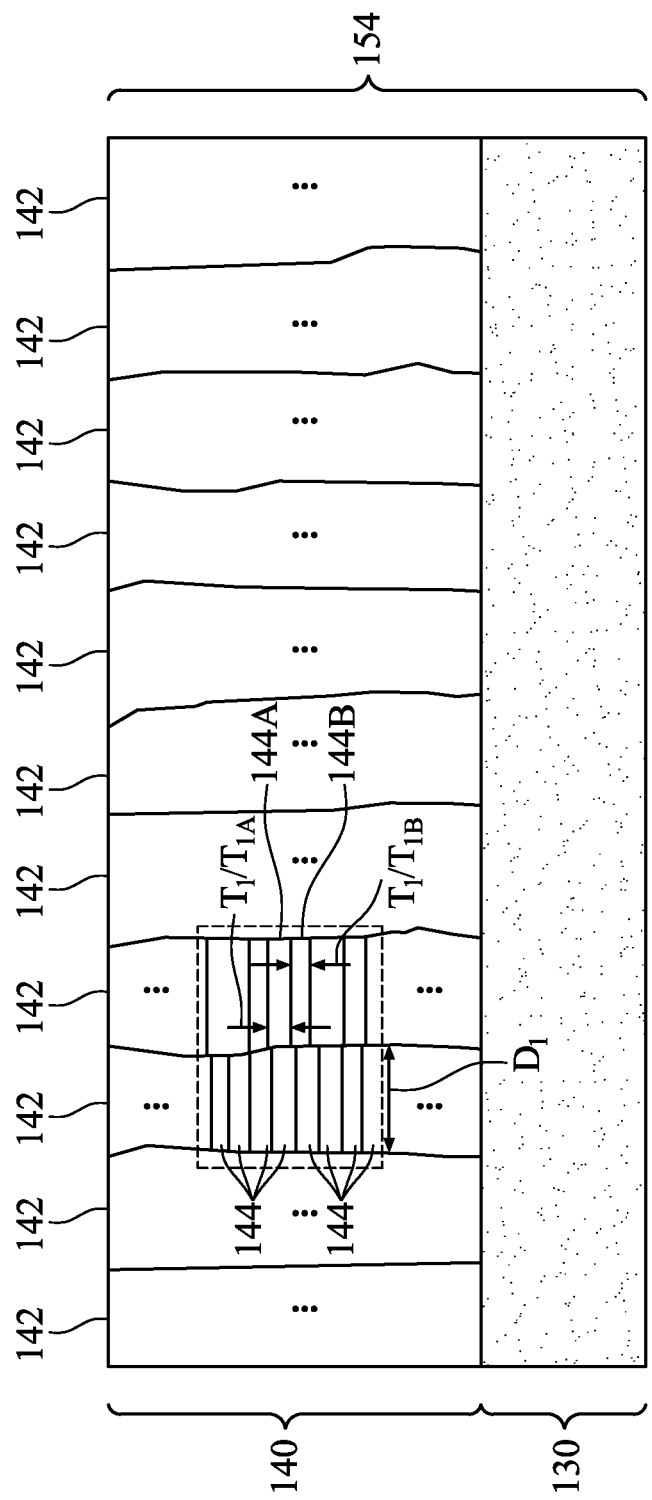
FIGS. 9-11 are various views of bonding pads, in accordance with some embodiments.

FIG. 9 illustrates a portion of a bonding pad 154, including a conductive layer 130 and a conductive layer 140. The conductive layer 140 includes a plurality of nanocolumns 142 therein. The nanocolumns 142 have a lateral dimension $D_1$ (width or length). In some embodiments, the lateral dimension $D_1$ of a nanocolumn 142 is in the range of 200 nm to 2000 nm. The nanocolumns 142 are elongated in the vertical direction and form columns in at the nanometer scale. The nanocolumns 142 have boundaries that are clear and distinguishable, for example, when viewed in X Ray Diffraction (XRD) images or Electron Back Scatter Diffraction (EBSD) images. Specifically, the nanocolumns 142 are separated from each other by vertical boundaries. The nanocolumns 142 may (or may not) extend away from the top surface of the conductive layer 130 to the top surface of the conductive layer 140. The edges of the nanocolumns 142 are substantially vertical, and may (or may not) be slightly curved or tilted, with the general trend being upward from the conductive layer 130.

FIG. 9 also illustrates details in some of the nanocolumns 142. The details of a middle portion of two nanocolumns 142 are shown. It should be appreciated that the other nanocolumns 142 may have similar structures as the illustrated nanocolumns 142. In accordance with some embodiments, each nanocolumn 142 includes a plurality of nanoplates 144 stacked up in the vertical direction to form the nanocolumn 142. The nanoplates 144 have interfaces that are clearly distinguishable, for example, when viewed in XRD images or EBSD images. The lateral dimensions $D_1$ of the nanoplates 144 are also the lateral dimension $D_1$ of the corresponding nanocolumns 142. The nanoplates 144 have a thickness $T_1$. In some embodiments, the thickness $T_1$ of a nanoplate 144 is in the range of 5 nm to 400 nm. In the cross-sectional view, the nanoplates 144 are elongated, with the lateral dimension $D_1$ of each nanoplate 144 being greater than its corresponding thicknesses $T_1$. In some embodiments, the ratio $D_1/T_1$ of a nanoplate 144 is in the range of 5 to 40. The thicknesses $T_1$ of different nanoplates 144 may be different from each other. In some embodiments, a ratio $T_{1A}/T_{1B}$, which is the thickness ratio of two neighboring nanoplates 144A, 144B is in the range of 0.25 to 80. The thicknesses $T_1$ of different nanoplates 144 may be the same as each other, such that the ratio $T_{1A}/T_{1B}$ is equal to 1.0. Further, the ratio of the greatest thickness of the nanoplates 144 to the smallest thickness of the nanoplates 144 in a nanocolumn 142 may be less than about 80. The top and bottom surfaces of nanoplates 144 in a nanocolumn 142 may be level with, higher than, or lower than (in a random way) the top and bottom surfaces of their contacting nanoplates 144 in neighboring nanocolumns 142.

In some embodiments, all of the nanocolumns 142 have clearly distinguishable edges (for example, in XRD images or EBSD images) contacting the edges of the neighboring nanocolumns 142. The edges are also substantially vertical. In other embodiments, most of the nanocolumns 142 have clearly distinguishable edges (which are substantially vertical) to separate them from the neighboring nanocolumns 142, while a small amount (for example, less than 5 percent) of nanoplates 144 may extend into neighboring nanocolumns 142. For example, some of the nanoplates 144 in two neighboring nanocolumns 142 may merge with each other such that no distinguishable edges separate them from each other.

Figure 10:
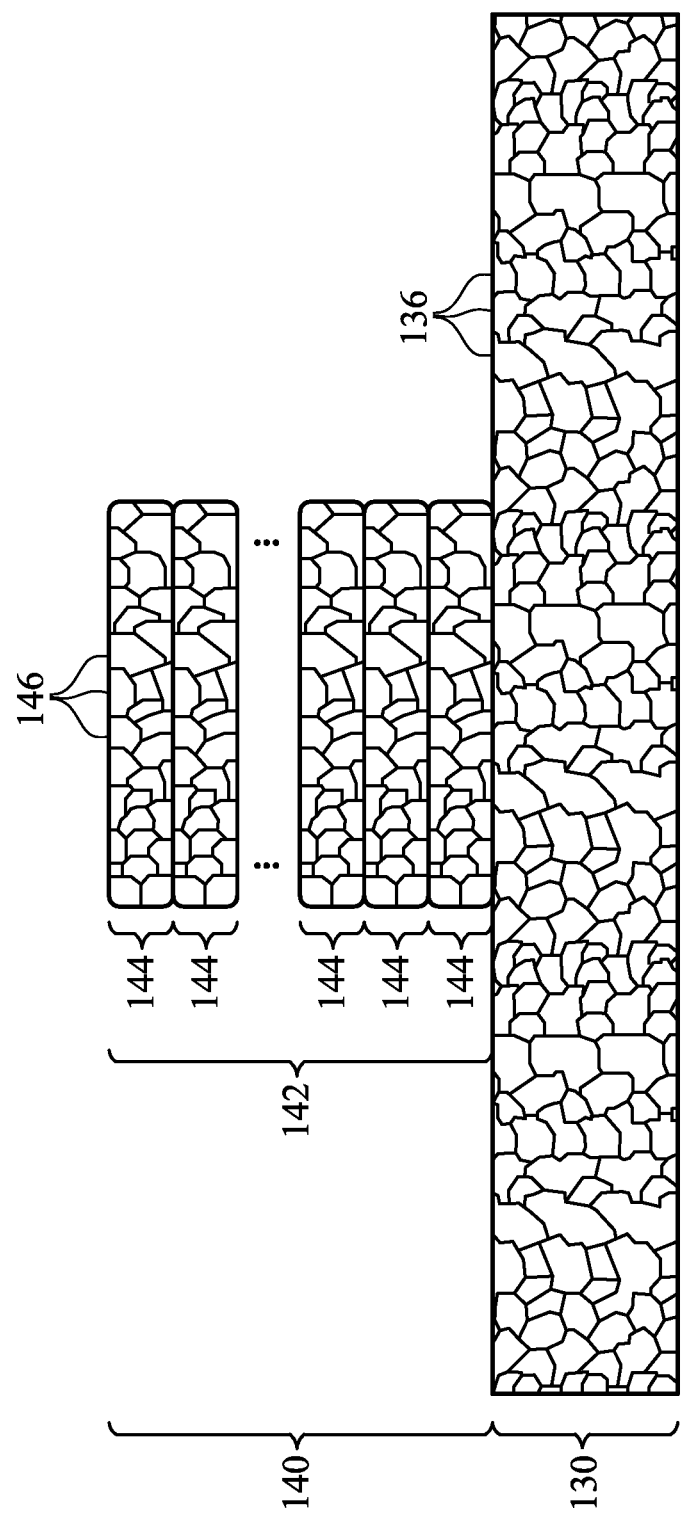

FIG. 10 illustrates the polycrystalline structure of the conductive layer 130 and the polycrystalline structure of the conductive layer 140. Specifically, the polycrystalline structure of a single nanocolumn 142 of the conductive layer 140 is shown. Other nanocolumns 142 are omitted for illustration clarity.

The conductive layer 130 has a polycrystalline structure including a plurality of grains 136 therein. Each of the grains 136 has a crystalline structure that is different from and/or misaligned from the crystalline structure of its neighboring grains 136 to form boundaries. The grains 136 inside the conductive layer 130 may have shapes different from each other and sizes different from each other. The boundaries of the grains 136 inside the conductive layer 130 are irregular (random without repeating patterns) and are not aligned to each other, such that the pattern of the grains 136 is irregular. The irregular pattern of the grains 136 is distributed throughout the conductive layer 130.

The grains 136 of the conductive layer 130 have a non-uniform orientation. Specifically, the grains 136 of the conductive layer 130 have random lattice orientations. As such, no majority of the grains 136 of the conductive layer 130 has a same lattice direction.

Each nanoplate 144 has a polycrystalline structure including a plurality of grains 146 therein. Each of the grains 146 has a crystalline structure that is different from and/or misaligned from the crystalline structure of its neighboring grains 146 to form boundaries. The grains 146 inside each nanoplate 144 may have shapes different from each other and sizes different from each other. The boundaries of the grains 146 inside each nanoplate 144 are irregular (random without repeating patterns), and are not aligned to each other. The irregular pattern of the grains 146 in each nanoplate 144 is distributed throughout the nanoplate 144. The top surfaces of the top grains 146 inside each nanoplate 144 are substantially coplanar with each other to form a substantially planar top surface of the nanoplate 144, which also forms a planar interface with its overlying nanoplate 144. In some embodiments, the top surfaces of the top grains 146 of a nanoplate 144 have height variations smaller than about 5 percent of the thickness $T_1$. Similarly, the bottom surfaces of the bottom grains 146 inside each nanoplate 144 are substantially coplanar with each other to form a substantially planar bottom surface of the nanoplate 144. In some embodiments, the bottom surfaces of the bottom grains 146 of a nanoplate 144 have height variations smaller than about 5 percent of the thickness $T_1$. The edges of the grains 146 at a sidewall of a nanoplate 144 are also substantially aligned to form substantially vertical edges. In some embodiments, the offsets of the edges of the grains 146 at a sidewall of a nanoplate 144 are smaller than about 10 percent of the thickness $T_1$. Accordingly, in the cross-sectional view, each nanoplate 144 may have a rectangular shape with clearly distinguishable boundaries. The nanoplates 144 are separated from each other by horizontal boundaries.

The grains 146 of the nanoplates 144 have a uniform orientation. Specifically, the majority of the grains 146 of the nanoplates 144 may have a same lattice direction, which may be in <111> crystal plane. In some embodiments, more than 85 percent (by volume) of the grains 146 are <111> oriented, while the rest of the percent (by volume) of the grains 146 have other lattice orientations. When the majority of the grains 146 of the nanoplates 144 have a same lattice direction and no majority of the grains 136 of the conductive layer 130 have a same lattice direction, the grains 146 of the nanoplates 144 may be said to have a greater uniformity than the grains 136 of the conductive layer 130.

Figure 11:
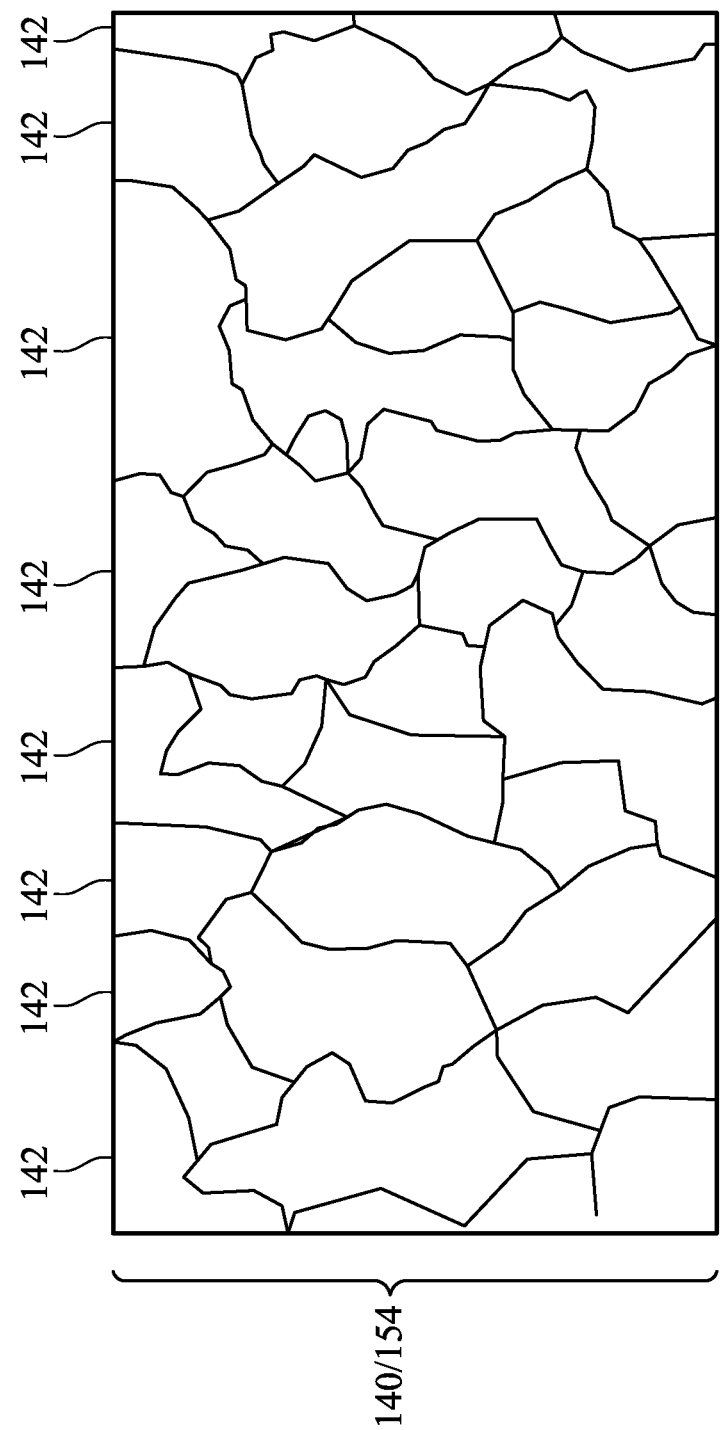

FIG. 11 is a top-down view of a portion of bonding pad 154, and specifically, a portion of a conductive layer 140. In the conductive layer 140, a plurality of the nanocolumns 142 are arranged next to and joining with each other. The nanoplates 144 in a same nanocolumn 142 may have the same (or similar) shape and the same (or similar) size in the top-down view, which are also the shape and the size, respectively, in the top-down view of the respective nanocolumn 142 formed by these nanoplates 144.

As shown in FIGS. 9-11, a plurality of grains 146 collectively form the nanoplates 144, which have clear top surfaces, clear bottom surface, and clear edges, each of which are formed due to the alignment of the outer surfaces of the outer grains 146. A plurality of nanoplates 144 are stacked to form a nanocolumn 142. A plurality of nanocolumns 142 are further arranged to form a conductive layer 140. In some embodiments, all of the nanocolumns 142 include nanoplates 144 therein. In other embodiments, some (for example, more than about 80 percent) of the nanocolumns 142 include nanoplates 144 therein, and those nanocolumns 142 may be referred to as stacked nano columns.

There may (or may not) be other nanocolumns 142 that do not have stacked nanoplates 144 therein, and those nanocolumns 142 may be referred to as non-stacked nanocolumns 142. The non-stacked nanocolumns 142 also have polycrystalline structures including a plurality of grains 146 therein, but do not have clear interfaces therein to divide the non-stacked nanocolumns 142 into stacked nano plates. Rather, the irregular pattern of grains 146 is distributed throughout the non-stacked nanocolumns 142. In some embodiments, the non-stacked nanocolumns 142 extend from the top surface of the conductive layer 130 to the top surface of the conductive layer 140. The conductive layer 130 has a similar structure as the non-stacked nanocolumns 142, and hence the non-stacked nanocolumns 142 may merge with the conductive layer 130 without forming distinguishable interfaces. In yet other embodiments, some of the nanocolumns 142 are divided into upper portions and lower portions, and the upper portions may be the non-stacked nanocolumns 142, while the corresponding lower portions are stacked nanocolumns 142, or vice versa.

The polycrystalline structures of the conductive layers 130, 140 may be formed by controlling parameters of the plating processes used to form the conductive layers 130, 140. Specifically, plating the conductive layers 130, 140 by utilizing the plating currents and durations previously described allows the conductive layers 130, 140 to be formed with desired polycrystalline structures.

Figure 12:
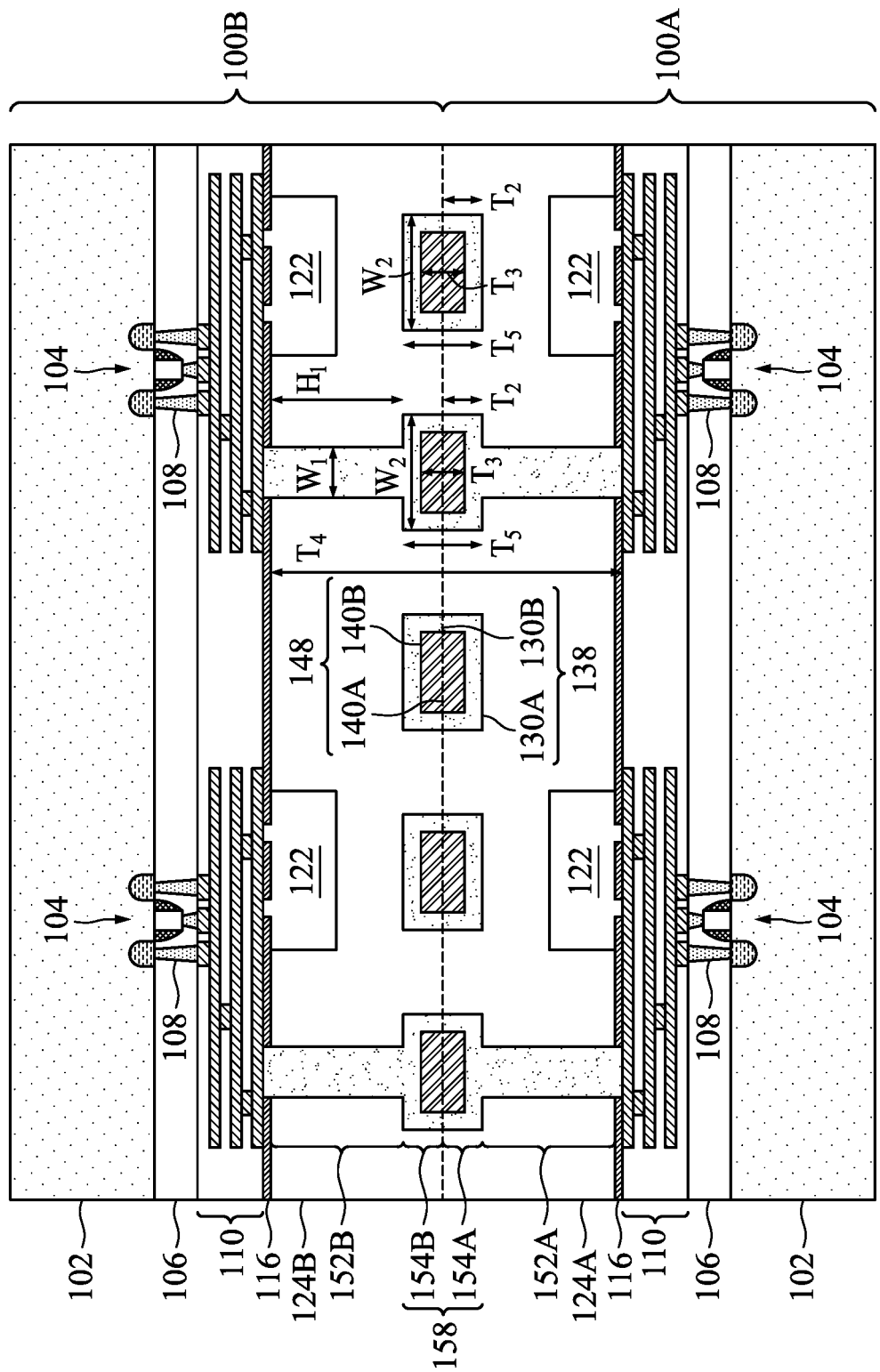
FIG. 12 is a cross-sectional view of a die stack, in accordance with some embodiments.

FIG. 12 is a cross-sectional view of a die stack, in accordance with some embodiments. The die stack includes two of the integrated circuit dies 100 (including a first integrated circuit die 100A and a second integrated circuit die 100B) that are bonded in a face-to-face manner. As such, the front side of the first integrated circuit die 100A is bonded to the front side of the second integrated circuit die 100B. The die stack may be part of an integrated circuit package, such as a system-on-integrated-chip (SoIC) package or the like.

As an example of the bonding process, the first integrated circuit die 100A may be bonded to the second integrated circuit die 100B by hybrid bonding. The dielectric layers 124 (including a dielectric layer 124A and a dielectric layer 124B) are directly bonded through dielectric-to-dielectric bonding, without using any adhesive material (e.g., die attach film). The bonding pads 154 (including bonding pads 154A and bonding pads 154B) are directly bonded through metal-to-metal bonding, without using any eutectic material (e.g., solder). The bonding may include a pre-bonding and an annealing. During the pre-bonding, a small pressing force is applied to press the integrated circuit dies 100A, 100B against one another. The pre-bonding is performed at a low temperature, such as about room temperature, such as a temperature in the range of 15° C. to 30° C., and after the pre-bonding, the dielectric layer 124A and the dielectric layer 124B are bonded to each other. The bonding strength is then improved in a subsequent annealing step, in which the dielectric layers 124A, 124B and the bonding pads 154A, 154B are annealed. After the annealing, direct bonds such as fusion bonds are formed, bonding the dielectric layer 124A to the dielectric layer 124B. For example, the bonds can be covalent bonds between the material of the dielectric layer 124A and the material of the dielectric layer 124B. The bonding pads 154A are connected to the bonding pads 154B with a one-to-one correspondence. The bonding pads 154A and the bonding pads 154B may be in physical contact after the pre-bonding, or may expand to be brought into physical contact during the annealing. Further, during the annealing, the material of the bonding pads 154A and the bonding pads 154B (e.g., copper) intermingles, so that metal-to-metal bonds are also formed. Hence, the resulting bonds between the integrated circuit dies 100A, 100B are hybrid bonds that include both dielectric-to-dielectric bonds and metal-to-metal bonds.

The top surfaces of the bonding pads 154 include the top surfaces of nano-twinned copper layers (e.g., the conductive layers 140), such that the interfaces of respective pairs of bonding pads 154 include nano-twinned copper. Nano-twinned copper layers (e.g., the conductive layers 140) may intermingle at a lower temperature and a lower pressure than non-twinned copper layers (e.g., the conductive layers 130). As such, the bonding pads 154A, 154B may be annealed at a low temperature and at a low pressure (e.g., a low vacuum) during the bonding process. Additionally, the bonding pads 154A, 154B may be annealed for a short duration during the bonding process. The bonding process is a low-temperature bonding process. In this context, a low-temperature bonding process is a bonding process performed at a temperature of less than about 300° C. and with a pressure of less than about 1000 kgf/cm². In some embodiments, the dielectric layers 124A, 124B and the bonding pads 154A, 154B are annealed at a temperature in the range of 150° C. to 250° C. during the bonding process. Utilizing a low-temperature bonding process may improve the reliability of the resulting die stack and improve the ease of die integration. Additionally, nano-twinned copper can withstand greater tensile strain and has greater electromigration than non-twinned copper. As such, the bonding strength between the bonding pads 154A, 154B is large, and the bonding strength does not significantly decrease as a result of any subsequently performed thermal annealing processes.

When the material of the bonding pads 154A, 154B intermingles during bonding, pairs of the bonding pads 154A, 154B form respective bonded pad structures 158. Specifically, when the conductive layers 130 (including conductive layers 130A, 130B) of the respective pairs of the bonding pads 154A, 154B are bonded, they merge to form respective bonded layer structures 138. Similarly, when the conductive layers 140 (including conductive layers 140A, 140B) of the respective pairs of the bonding pads 154A, 154B are bonded, they merge to form respective bonded layer structures 148. The interface between the bonding pads 154A, 154B of a bonded pad structure 158 (including the interfaces of the conductive layers 130A, 130B and the interfaces of the conductive layers 140A, 140B) may be indistinguishable. The resulting bonded layer structures 148 are each surrounded on all sides by respective bonded layer structures 138.

The dimensions of the bonded pad structures 158 may be small, which can help increase bond strength during a low-temperature bonding process. In some embodiments, the conductive vias 152 have a width $W_1$ of less than about 8 μm, such as in the range of 1 μm to 8 μm. In some embodiments, the bonding pads 154 have a width $W_2$ of less than about 10 μm, such as in the range of 2 μm to 10 μm. In some embodiments, the conductive vias 152 have a height $H_1$ of greater than about 4 μm, such as in the range of 4 μm to 12 μm. In some embodiments, the bonding pads 154 have a thickness $T_2$ of greater than about 2 μm, such as in the range of 2 μm to 6 μm. In some embodiments, the bonded layer structures 148 have a thickness $T_3$ of greater than about 0.2 μm, such as in the range of 0.2 μm to 12 μm. In some embodiments, the thickness of the conductive layer 140 of each bonding pad 154 (e.g., about half the thickness $T_3$) is greater than about 0.1 μm, such as in the range of 0.1 μm to 6 μm. In some embodiments, respective pairs of the conductive vias 152A, 152B have a combined thickness $T_4$ of greater than about 8 μm, such as in the range of 8 μm to 24 μm. The thickness $T_3$ is small relative the combined thickness $T_4$. In some embodiments, a ratio $T_3/T_4$ is greater than about 0.025, such as in the range of 0.025 to 0.75. In some embodiments, the bonded pad structures 158 have a thickness $T_5$ of greater than about 4 μm, such as in the range of 4 μm to 12 μm. The thickness $T_3$ is small relative the thickness $T_5$. In some embodiments, a ratio $T_3/T_5$ is greater than about 0.05, such as in the range of 0.05 to 1.

Figure 13:
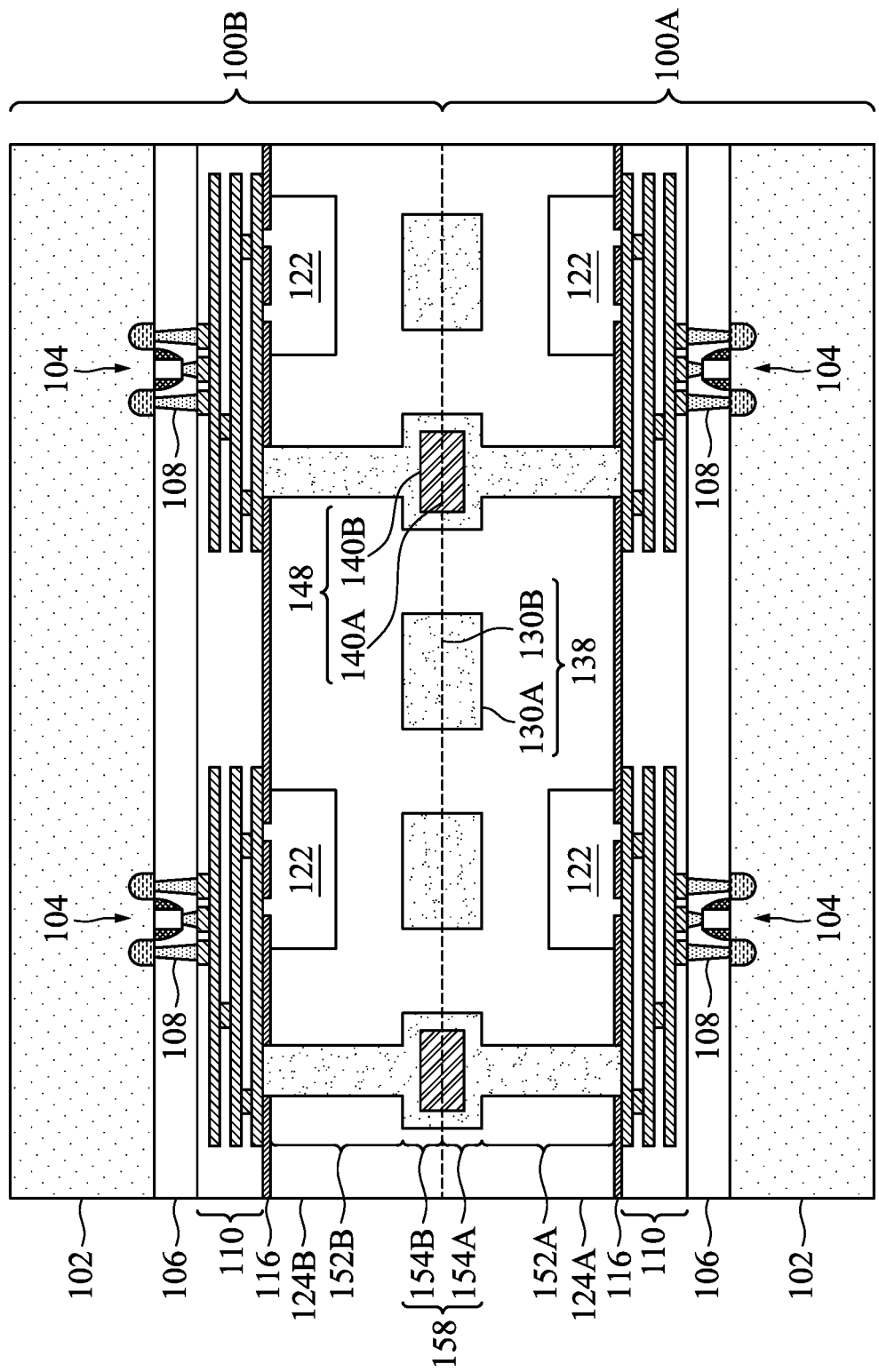
FIG. 13 is a cross-sectional view of a die stack, in accordance with some embodiments.

FIG. 13 is a cross-sectional view of a die stack, in accordance with some embodiments. This embodiment is similar to that described for FIG. 12, except not all of the bonding pads 154 include nano-twinned copper layers (e.g., conductive layers 140). Specifically, the bonding pads 154 formed in the trenches 128A (see FIGS. 4-6) include portions of both the conductive layers 130, 140, but the bonding pads 154 formed in the trenches 128B (see FIGS. 4-6) include portions of the conductive layer 130 and do not include any portions of the conductive layer 140. Whether or not the bonding pads 154 are formed to include portions of the conductive layer 140 may be controlled by adjusting the aspect ratio of the trenches 128, such that the conductive layer 140 is plated (see FIG. 6) in trenches 128A with a high aspect ratio but is not plated in trenches 128B with a low aspect ratio. As a result, the thickness of the bonding pads 154 in the trenches 128A is greater than the thickness of the bonding pads 154 in the trenches 128B. Omitting the nano-twinned copper layers (e.g., the conductive layers 140) from some of the bonding pads 154 may decrease manufacturing costs while still allowing for the use of low-temperature bonding.

Figure 14:
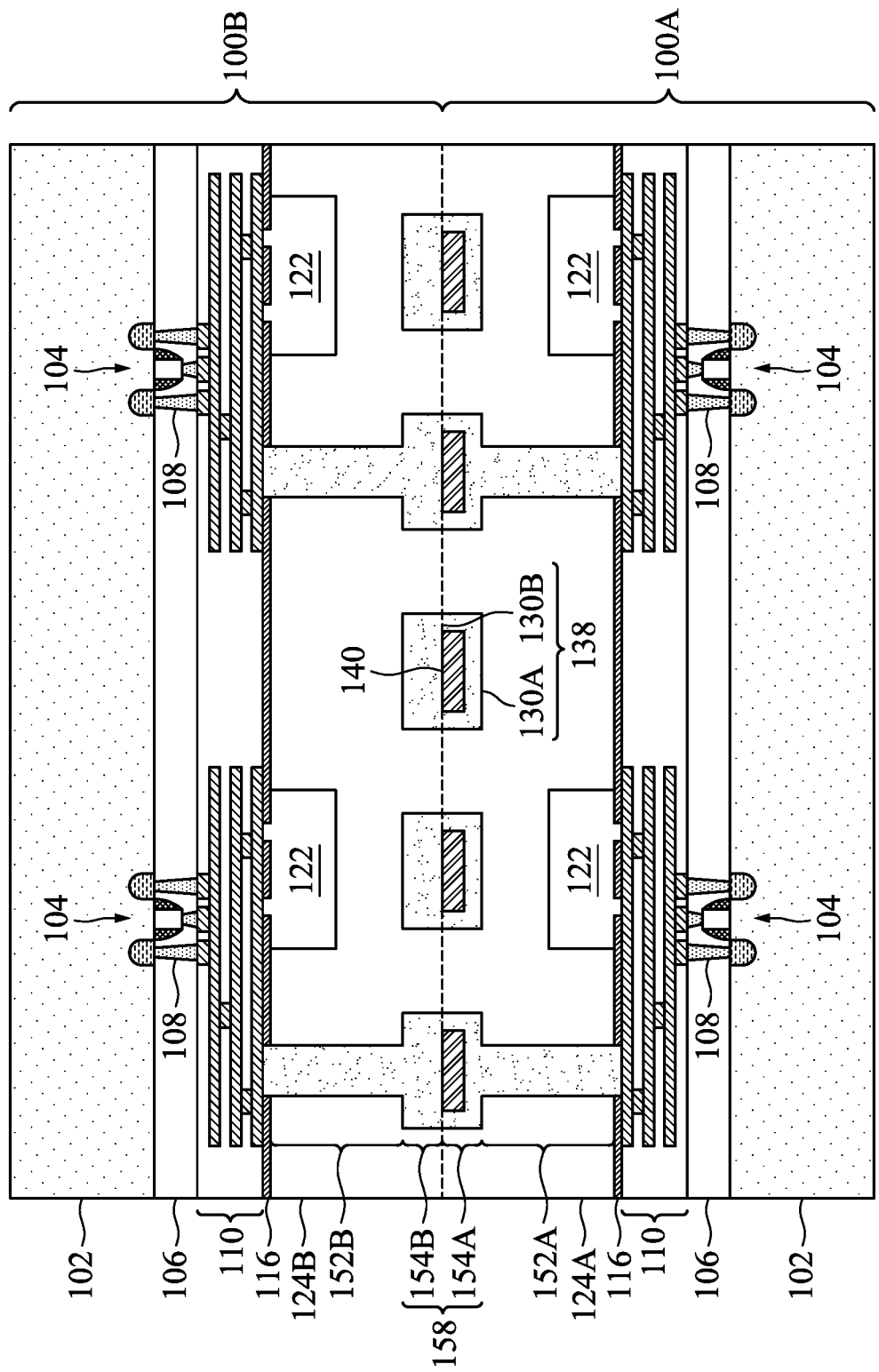
FIG. 14 is a cross-sectional view of a die stack, in accordance with some embodiments.

FIG. 14 is a cross-sectional view of a die stack, in accordance with some embodiments. This embodiment is similar to that described for FIG. 12, except only the bonding pads 154A of the first integrated circuit die 100A include nano-twinned copper layers (e.g., conductive layers 140A), and the bonding pads 154B of the second integrated circuit die 100B do not include nano-twinned copper layers. The nano-twinned copper layers may be omitted from the second integrated circuit die 100B by plating the conductive layer 130B (see FIG. 5) of the second integrated circuit die 100B to a thickness that is large, so that the conductive layer 130B fills the trenches 128 (including the trenches 128A, 128B, see FIGS. 4-6) of the second integrated circuit die 100B. Specifically, the conductive layer 130B is formed to a thickness that is large enough that the conductive layer 130B completely fills (and may overfill) the trenches 128. Omitting nano-twinned copper layers from the second integrated circuit die 100B may decrease manufacturing costs while still allowing for the use of low-temperature bonding. When nano-twinned copper layers are omitted from the second integrated circuit die 100B, the conductive layers 130B of the bonding pads 154B are bonded to both the conductive layers 130A, 140A of the bonding pads 154A.

The previously described die stacks may be formed before or after one or both of the integrated circuit dies 100 are singulated (as described for FIG. 8). For example, die-to-die bonding may be performed, where a singulated first integrated circuit die 100A is bonded to a singulated second integrated circuit die 100B. Similarly, die-to-wafer bonding may be performed, where a singulated first integrated circuit die 100A is bonded to a wafer that includes an unsingulated second integrated circuit die 100B. Likewise, wafer-to-wafer bonding may be performed, where a first wafer that includes an unsingulated first integrated circuit die 100A is bonded to a second wafer that includes an unsingulated second integrated circuit die 100B.

Figure 15:
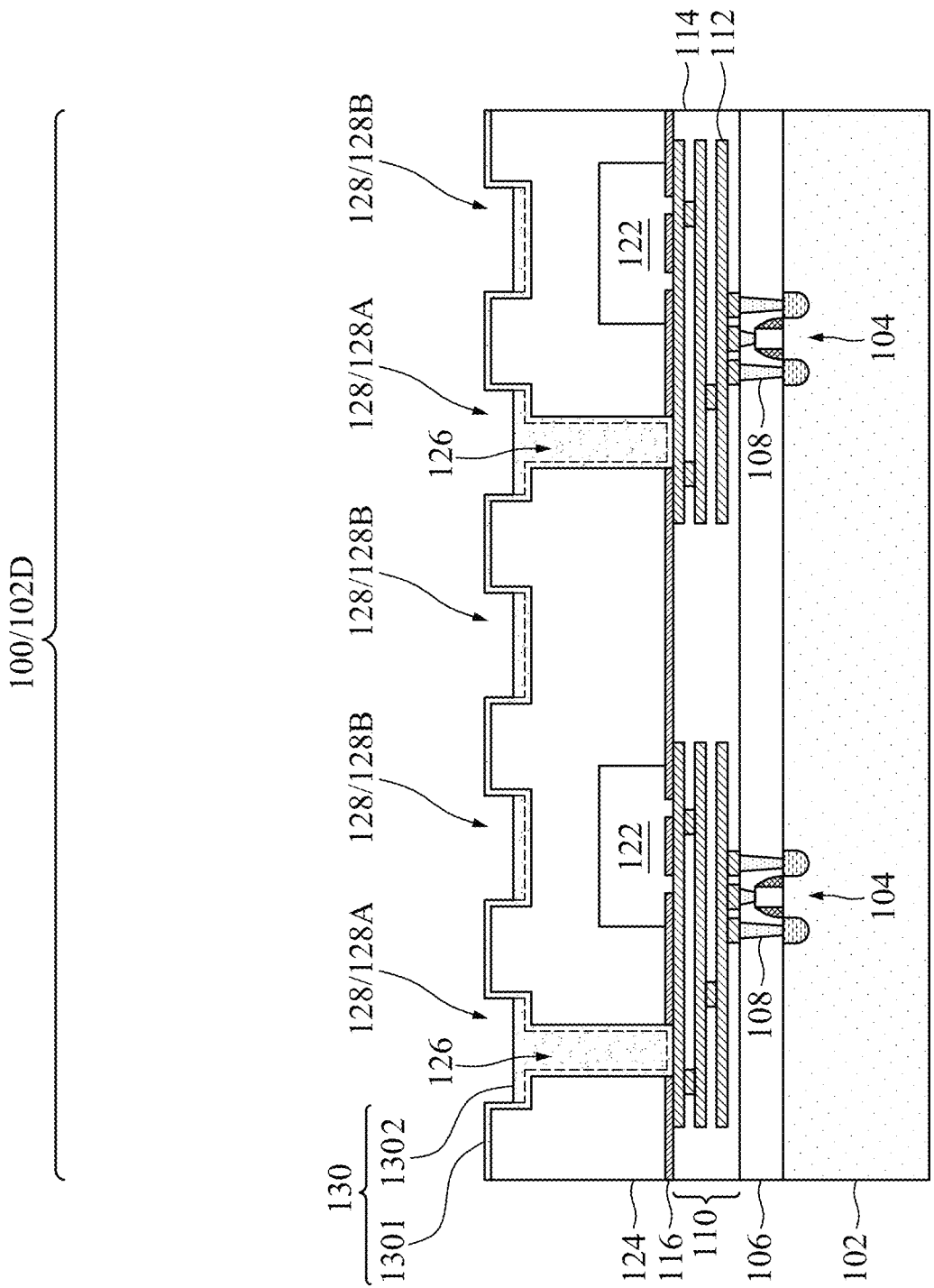
FIGS. 15-17 are cross-sectional views of intermediate stages in the manufacturing of an integrated circuit die, in accordance with some other embodiments.
Figure 16:
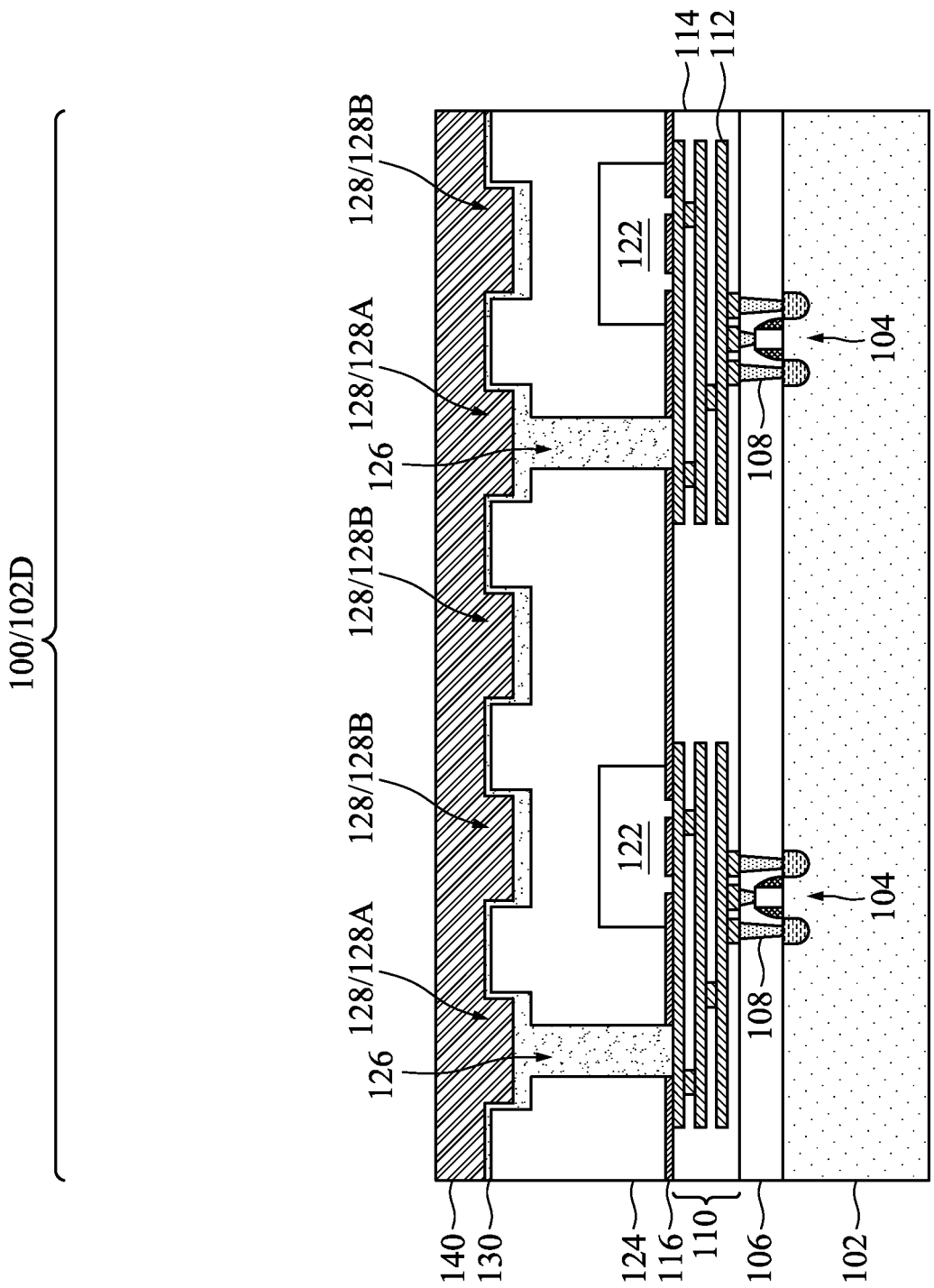
Figure 17:
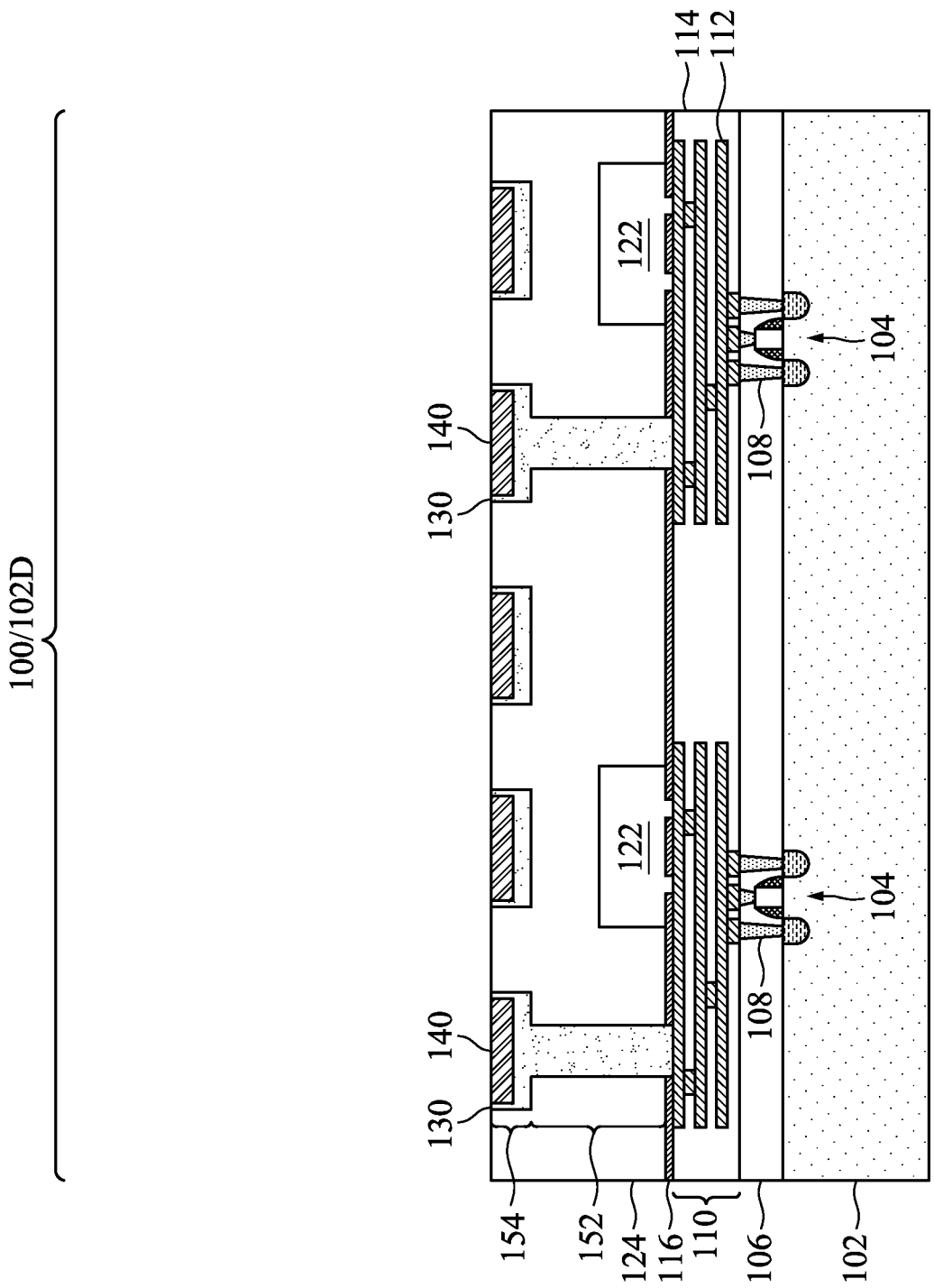

FIGS. 15-17 are cross-sectional views of intermediate stages in the manufacturing of an integrated circuit die 100, in accordance with some other embodiments. To manufacture the integrated circuit die 100, appropriate steps as described for FIGS. 1-4 may be performed. The steps described for FIGS. 15-17 may then be performed in lieu of the steps described for FIGS. 5-7. Appropriate steps as described for FIG. 8 may then be performed to complete manufacturing of the integrated circuit die 100.

In FIG. 15, a conductive layer 130 is formed in the via openings 126 and the lower portions of the trenches 128. In this embodiment, the conductive layer 130 is formed by a bottom-up process, such that the conductive layer 130 in the trenches 128 does not conformally line the bottoms and sidewalls of the trenches 128. Accordingly, the thickness of the conductive layer 130 at the bottoms of the trenches 128 is greater than the thickness of the conductive layer 130 at the sidewalls of the trenches 128.

As an example to form the conductive layer 130 by a bottom-up process, a seed layer 1301 is formed on the dielectric layer 124 and in the interconnect openings (including the via openings 126 and the trenches 128). In some embodiments, the seed layer 1301 is a metal layer, which may be a single layer or a composite layer including a plurality of sub-layers formed of different materials. In some embodiments, the seed layer 1301 includes a titanium layer and a copper layer over the titanium layer. The seed layer 1301 may be formed using, for example, physical vapor deposition (PVD) or the like. A conductive material 1302, such as one of those previously described, is then plated on the seed layer 1301. In some embodiments, the conductive material 1302 is copper formed by an electroplating process. The electroplating process has a low plating conformality, such that the plating rate in the via openings 126 is greater than the plating rate in the trenches 128. Specifically, the conductive material 1302 is formed by submerging the seed layer 1301 in a plating solution. The plating solution may be, e.g., a sulfuric acid electrolyte. The plating solution includes cations of the conductive material 1302, and further includes an accelerator agent, a suppressor agent, and a leveler agent. An electric current is applied to the plating solution to reduce the cations and thereby form the conductive material 1302. Including the accelerator agent, the suppressor agent, and the leveler agent in the plating solution reduces the plating conformality such that plating is performed in a bottom-up manner. Specifically, the accelerator agent increases the plating rate in the via openings 126, and the suppressor agent and leveler agent reduce the plating rate in the trenches 128. As such, the conductive material 1302 is formed vertically from the bottom upward to fill the via openings 126 and the lower portions of the trenches 128. Timed processes may be utilized to stop the bottom-up plating of the conductive material 1302 before the conductive material 1302 fill the upper portions of the trenches 128. Forming the conductive material 1302 with a bottom-up process also decreases the risks of voids or cracks forming in the conductive vias 152. In some embodiments, substantially no conductive material 1302 is formed above the top surface of the dielectric layer 124.

In FIG. 16, a conductive layer 140 is formed in the upper portions of the trenches 128. The conductive layer 140 may be formed by a similar process (e.g., an electroplating process) as previously described for FIG. 6.

In FIG. 17, a removal process is performed to remove excess portions of the conductive layers 130, 140, which excess portions are over the top surface of the dielectric layer 124, thereby forming the conductive vias 152 and the bonding pads 154. The removal may be by a similar process (e.g., a planarization process) as previously described for FIG. 7. In this embodiment where the conductive layer 130 is formed in a bottom-up manner, a horizontal portion of a conductive layer 130 in a bonding pad 154 (e.g., a portion beneath the conductive layer 140) may have a greater thickness than a vertical portion of the conductive layer 130 in the bonding pad 154 (e.g., a portion between the conductive layer 140 and the dielectric layer 124).

Figure 18:
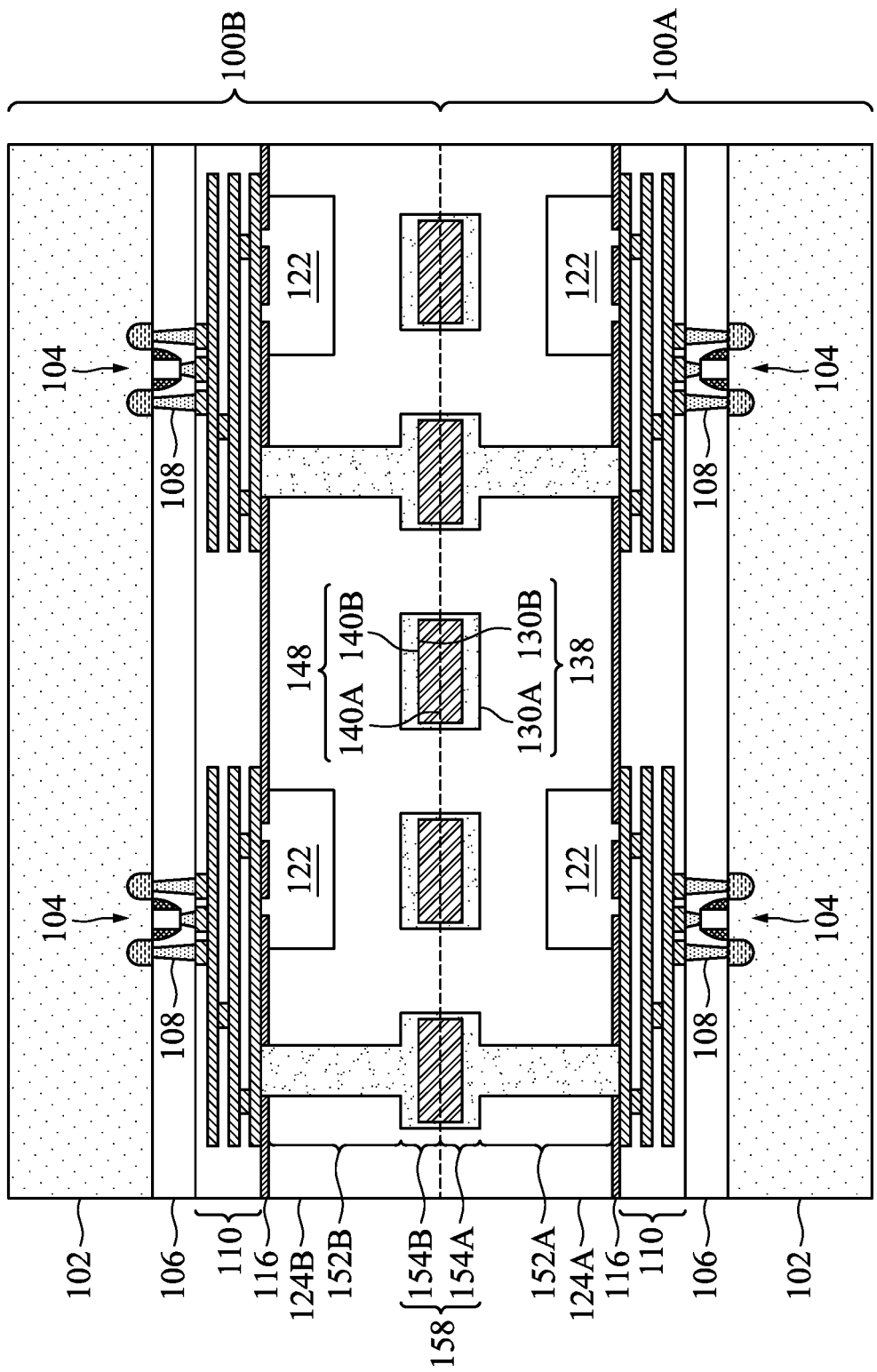
FIG. 18 is a cross-sectional view of a die stack, in accordance with some embodiments.

FIG. 18 is a cross-sectional view of a die stack, in accordance with some embodiments. This embodiment is similar to that described for FIG. 12, except the conductive layer 130 is formed by a bottom-up process.

Figure 19:
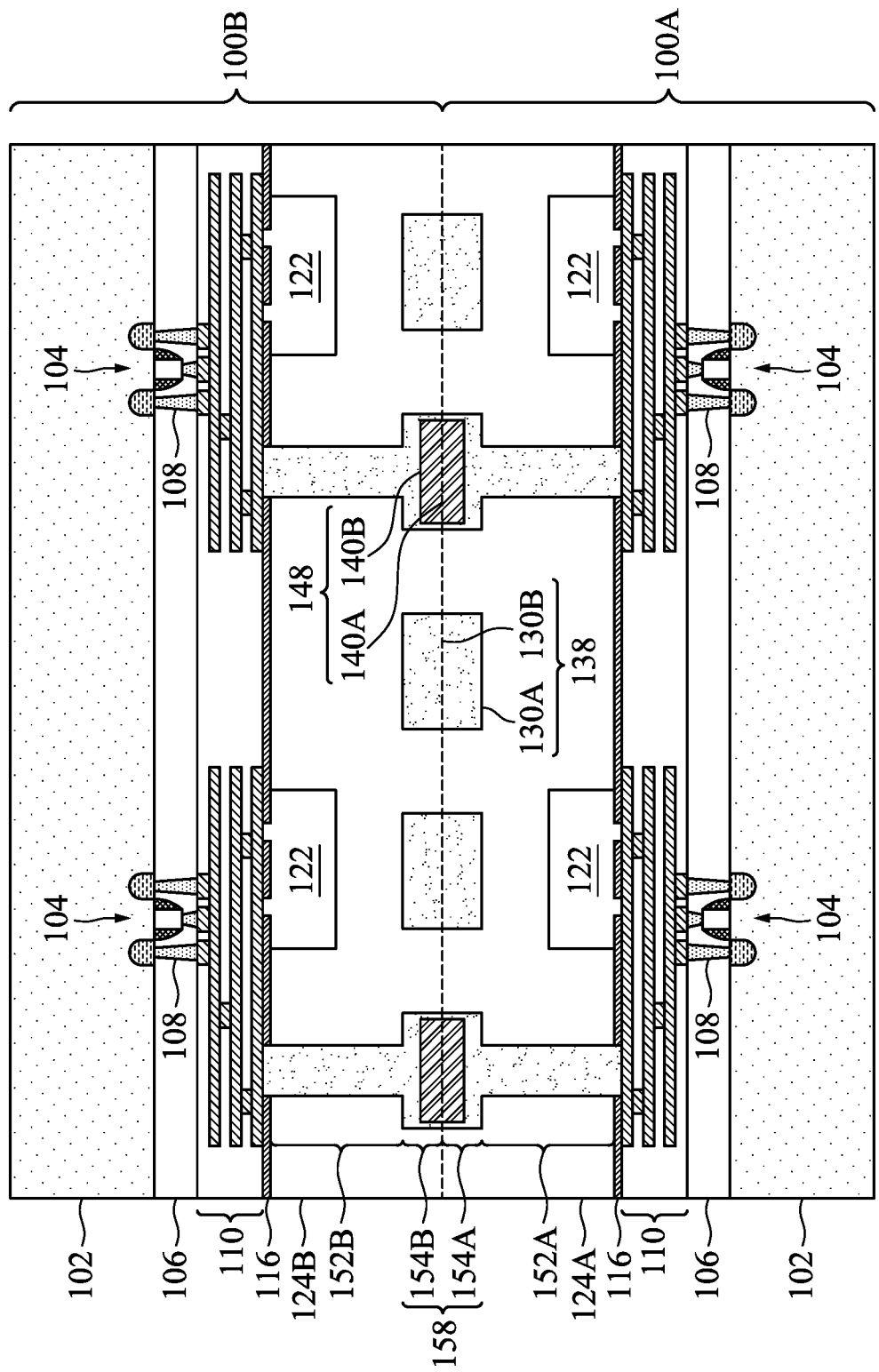
FIG. 19 is a cross-sectional view of a die stack, in accordance with some embodiments.

FIG. 19 is a cross-sectional view of a die stack, in accordance with some embodiments. This embodiment is similar to that described for FIG. 13, except the conductive layer 130 is formed by a bottom-up process.

Figure 20:
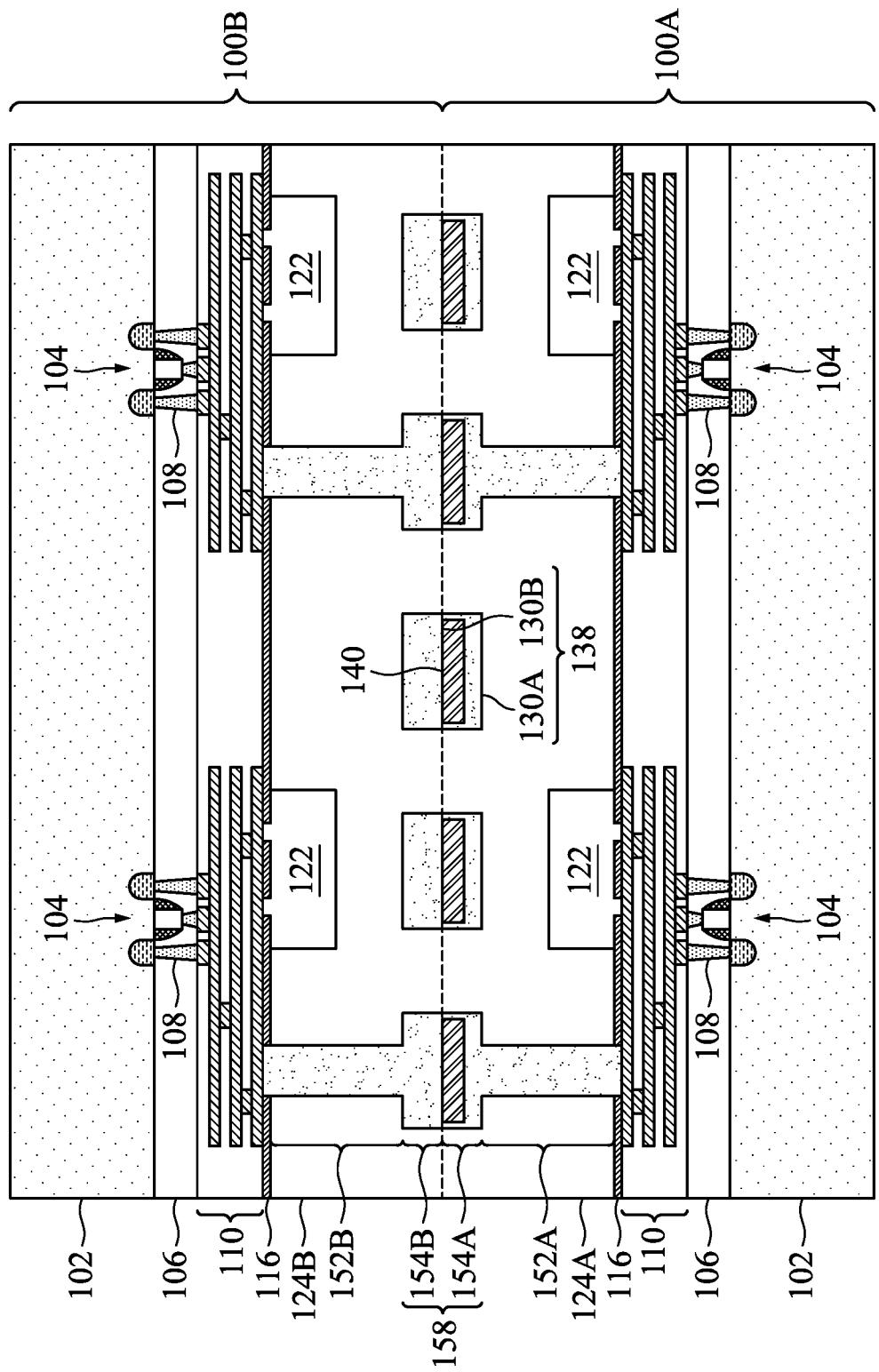
FIG. 20 is a cross-sectional view of a die stack, in accordance with some embodiments.

FIG. 20 is a cross-sectional view of a die stack, in accordance with some embodiments. This embodiment is similar to that described for FIG. 14, except the conductive layer 130 is formed by a bottom-up process.

Embodiments may achieve advantages. Forming at least some of the bonding pads 154 so that they include nanotwinned copper layers (e.g., the conductive layers 140) allows a low-temperature bonding process to be utilized during die bonding. Utilizing a low-temperature bonding process may improve reliability of the resulting die stack and improve the ease of die integration. Additionally, nanotwinned copper can withstand greater tensile strain and has greater electromigration than non-twinned copper. As such, the bonding strength between the bonding pads 154 is large, and the bonding strength does not significantly decrease as a result of any subsequently performed thermal annealing processes. Further, omitting the conductive layer 140 from the conductive vias 152 such that the conductive vias 152 include conductive layers 130 plated with a large plating conformality or a bottom-up process decreases the risks of voids or cracks forming in the conductive vias 152, particularly when the conductive vias 152 have a high aspect ratio.

In an embodiment, a device includes: a dielectric layer over an active surface of a semiconductor substrate; a conductive via in the dielectric layer, the conductive via including a first copper layer having a non-uniform grain orientation; and a bonding pad over the conductive via and in the dielectric layer, the bonding pad including a second copper layer having a uniform grain orientation, a top surface of the bonding pad being coplanar with a top surface of the dielectric layer. In some embodiments of the device, the second copper layer includes a plurality of copper nanocolumns, each of the copper nanocolumns including a plurality of copper nanoplates, the copper nanoplates stacked in a vertical direction extending away from the first copper layer. In some embodiments of the device, the copper nanocolumns are separated from each other by vertical boundaries. In some embodiments of the device, the copper nanoplates are separated from each other by horizontal boundaries. In some embodiments of the device, the first copper layer includes first grains having an irregular pattern distributed throughout the first copper layer, and each copper nanoplate of the copper nanoplates includes second grains having an irregular pattern distributed throughout the copper nanoplate. In some embodiments of the device, the bonding pad further includes the first copper layer, where the second copper layer is disposed over the first copper layer.

In an embodiment, a device includes: a first integrated circuit die including: a first dielectric layer; and a first bonding pad in the first dielectric layer, the first bonding pad including a first conductive layer and second conductive layer on the first conductive layer, the first conductive layer including first grains, the second conductive layer including second grains, no majority of the first grains having a same lattice direction, a majority of the second grains having a same lattice direction; and a second integrated circuit die including: a second dielectric layer directly bonded to the first dielectric layer with dielectric-to-dielectric bonds; and a second bonding pad in the second dielectric layer, the second bonding pad directly bonded to the first bonding pad with metal-to-metal bonds. In some embodiments of the device, the majority of the second grains are <111> oriented. In some embodiments of the device, the second bonding pad includes a third conductive layer and fourth conductive layer on the third conductive layer, the third conductive layer bonded to the first conductive layer, the fourth conductive layer bonded to the second conductive layer. In some embodiments of the device, the second bonding pad includes a third conductive layer, the third conductive layer bonded to the first conductive layer and to the second conductive layer. In some embodiments of the device, the first integrated circuit die further includes: a third bonding pad in the first dielectric layer, the third bonding pad including a third conductive layer, the third conductive layer including third grains having an irregular pattern distributed throughout the third bonding pad. In some embodiments of the device, the first conductive layer is a first copper layer and the second conductive layer is a second copper layer.

In an embodiment, a method includes: patterning an interconnect opening in a dielectric layer, the dielectric layer disposed over an active surface of a semiconductor substrate, the interconnect opening having a via opening and a trench over the via opening; plating a first copper layer in the interconnect opening, the first copper layer filling the via opening and lining the trench, the first copper layer having a non-uniform grain orientation; plating a second copper layer on the first copper layer, the second copper layer filling a remainder of the trench, the second copper layer having a uniform grain orientation; and planarizing the second copper layer, the first copper layer, and the dielectric layer until a top surface of the second copper layer is coplanar with a top surface of the first copper layer and a top surface of the dielectric layer. In some embodiments of the method, the second copper layer is plated with a greater plating current than the first copper layer. In some embodiments of the method, the second copper layer is plated for a longer duration than the first copper layer. In some embodiments of the method, the second copper layer is thicker than the first copper layer. In some embodiments of the method, the first copper layer includes first grains having an irregular pattern distributed throughout the first copper layer. In some embodiments of the method, the second copper layer includes a plurality of copper nanocolumns, each of the copper nanocolumns including a plurality of copper nanoplates, each copper nanoplate of the copper nanoplates including second grains having an irregular pattern distributed throughout the copper nanoplate. In some embodiments of the method, planarizing the second copper layer, the first copper layer, and the dielectric layer forms a first bonding pad in the dielectric layer, and the method further includes: contacting a second bonding pad to the first bonding pad; and bonding the first bonding pad to the second bonding pad with a low-temperature bonding process. In some embodiments of the method, the low-temperature bonding process includes: annealing the first bonding pad and the second bonding pad at a temperature in a range of 150° C. to 250° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   patterning an interconnect opening in a dielectric layer, the dielectric layer disposed over an active surface of a semiconductor substrate, the interconnect opening having a via opening and a trench over the via opening;
   plating a first copper layer in the interconnect opening, the first copper layer filling the via opening and lining the trench, the first copper layer having a non-uniform grain orientation;

plating a second copper layer on the first copper layer, the second copper layer filling a remainder of the trench, the second copper layer having a uniform grain orientation; and planarizing the second copper layer, the first copper layer, and the dielectric layer until a top surface of the second copper layer is coplanar with a top surface of the first copper layer and a top surface of the dielectric layer.

2. The method of claim 1, wherein the second copper layer is plated with a greater plating current than the first copper layer.

3. The method of claim 1, wherein the second copper layer is plated for a longer duration than the first copper layer.

4. The method of claim 1, wherein the second copper layer is thicker than the first copper layer.

5. The method of claim 1, wherein the first copper layer comprises first grains having an irregular pattern distributed throughout the first copper layer.

6. The method of claim 1, wherein the second copper layer comprises a plurality of copper nanocolumns, each of the copper nanocolumns comprising a plurality of copper nanoplates, each copper nanoplate of the copper nanoplates comprising second grains having an irregular pattern distributed throughout the copper nanoplate.

7. The method of claim 1, wherein planarizing the second copper layer, the first copper layer, and the dielectric layer forms a first bonding pad in the dielectric layer, and the method further comprises:
contacting a second bonding pad to the first bonding pad; and
bonding the first bonding pad to the second bonding pad with a low-temperature bonding process.

8. The method of claim 7, wherein the low-temperature bonding process comprises:
annealing the first bonding pad and the second bonding pad at a temperature in a range of 150° C. to 250° C.

9. A method comprising:
forming a first integrated circuit die comprising:
a first dielectric layer; and
a first bonding pad in the first dielectric layer, the first bonding pad comprising a first conductive layer and a second conductive layer on the first conductive layer, the first conductive layer comprising first grains, the second conductive layer comprising second grains, no majority of the first grains having a same lattice direction, a majority of the second grains having a same lattice direction;
obtaining a second integrated circuit die comprising:
a second dielectric layer; and
a second bonding pad in the second dielectric layer; and
bonding the first dielectric layer to the second dielectric layer through dielectric-to-dielectric bonding; and
bonding the first bonding pad to the second bonding pad through metal-to-metal bonding.

10. The method of claim 9, wherein the majority of the second grains are <111> oriented.

11. The method of claim 9, wherein the second bonding pad comprises a third conductive layer and a fourth conductive layer on the third conductive layer, the third conductive layer bonded to the first conductive layer, the fourth conductive layer bonded to the second conductive layer.

12. The method of claim 9, wherein the second bonding pad comprises a third conductive layer, the third conductive layer bonded to the first conductive layer and to the second conductive layer.

13. The method of claim 9, wherein:
the first integrated circuit die further comprises a third bonding pad in the first dielectric layer, the third bonding pad comprising a third conductive layer, the third conductive layer comprising third grains having an irregular pattern distributed throughout the third bonding pad;
the second integrated circuit die further comprises a fourth bonding pad in the second dielectric layer; and
the method further comprises bonding the third bonding pad to the fourth bonding pad through metal-to-metal bonding.

14. The method of claim 9, wherein the first conductive layer and the second conductive layer are each formed of copper.

15. A method comprising:
patterning an interconnect opening in a dielectric layer, the interconnect opening having a via opening and a trench over the via opening;
plating a first copper layer in the interconnect opening, the first copper layer comprising first grains having an irregular pattern distributed throughout the first copper layer; and
plating a second copper layer on the first copper layer and in the trench, the second copper layer comprising a plurality of copper nanocolumns, each copper nanocolumn of the copper nanocolumns comprising a plurality of copper nanoplates, each copper nanoplate of the copper nanoplates comprising second grains having an irregular pattern distributed throughout the copper nanoplate.

16. The method of claim 15, wherein the second copper layer is plated with a greater plating current than the first copper layer.

17. The method of claim 15, wherein the second copper layer is plated for a longer duration than the first copper layer.

18. The method of claim 15, further comprising:
planarizing the second copper layer, the first copper layer, and the dielectric layer until a top surface of the second copper layer is coplanar with a top surface of the first copper layer and a top surface of the dielectric layer.

19. The method of claim 18, wherein planarizing the second copper layer, the first copper layer, and the dielectric layer forms a first bonding pad in the dielectric layer, and the method further comprises:
contacting a second bonding pad to the first bonding pad; and
annealing the first bonding pad and the second bonding pad at a temperature in a range of 150° C. to 250° C.

20. The method of claim 15, wherein the copper nanocolumns are separated from each other by vertical boundaries, and the copper nanoplates are separated from each other by horizontal boundaries.

* * * * *